(12) United States Patent
Mitzlaff

(10) Patent No.: US 10,103,696 B1
(45) Date of Patent: Oct. 16, 2018

(54) INTEGRATED GALLIUM NITRIDE POWER AMPLIFIER AND SWITCH

(71) Applicant: Tagore Technology, Inc., Arlington Heights, IL (US)

(72) Inventor: James E. Mitzlaff, Arlington Heights, IL (US)

(73) Assignee: Tagore Technology, Inc., Arlington Heights, IL (US)

( * ) Notice: Subject to any disclaimer, the term of this patent is extended or adjusted under 35 U.S.C. 154(b) by 19 days.

(21) Appl. No.: 15/487,112

(22) Filed: Apr. 13, 2017

(51) Int. Cl.
| | |
|---|---|
| *H03F 3/16* | (2006.01) |
| *H03F 3/213* | (2006.01) |
| *H03F 3/195* | (2006.01) |
| *H01L 29/20* | (2006.01) |
| *H01L 29/778* | (2006.01) |
| *H01L 49/02* | (2006.01) |
| *H01L 23/522* | (2006.01) |
| *H01L 27/06* | (2006.01) |
| *H01L 29/06* | (2006.01) |
| *H01L 27/02* | (2006.01) |
| *H01L 29/205* | (2006.01) |
| *H01L 23/66* | (2006.01) |

(52) U.S. Cl.
CPC ......... *H03F 3/213* (2013.01); *H01L 23/5223* (2013.01); *H01L 23/66* (2013.01); *H01L 27/0207* (2013.01); *H01L 27/0605* (2013.01); *H01L 27/0629* (2013.01); *H01L 28/20* (2013.01); *H01L 28/40* (2013.01); *H01L 29/0696* (2013.01); *H01L 29/2003* (2013.01); *H01L 29/205* (2013.01); *H01L 29/7787* (2013.01); *H03F 3/195* (2013.01); *H01L 2223/665* (2013.01); *H01L 2223/6655* (2013.01); *H03F 2200/171* (2013.01); *H03F 2200/21* (2013.01); *H03F 2200/267* (2013.01); *H03F 2200/387* (2013.01); *H03F 2200/414* (2013.01); *H03F 2200/429* (2013.01); *H03F 2200/451* (2013.01)

(58) Field of Classification Search
CPC ................................ H03F 3/213; H03F 3/195
USPC ................... 330/277, 302, 127, 116, 51, 297
See application file for complete search history.

(56) References Cited

U.S. PATENT DOCUMENTS

| | | | | |
|---|---|---|---|---|
| 4,422,047 | A | * | 12/1983 | Wright ..................... H03G 5/24 330/279 |
| 6,882,829 | B2 | | 4/2005 | Mostov et al. |
| 7,088,971 | B2 | | 8/2006 | Burgener et al. |
| 8,131,251 | B2 | | 3/2012 | Burgener et al. |
| 2013/0314163 | A1 | * | 11/2013 | Costa ..................... H03F 3/193 330/296 |

* cited by examiner

*Primary Examiner* — Khanh V Nguyen
*Assistant Examiner* — Khiem Nguyen
(74) *Attorney, Agent, or Firm* — Fleit Gibbons Gutman Bongini Bianco PL

(57) ABSTRACT

A multi-band RF power amplifier circuit fabricated using GaN technology includes a RF power amplifier coupled to a multi-band RF switch without an intervening impedance matching network between the RF power amplifier and the multi-band RF switch. The multi-band RF switch includes a plurality of Unit HEMT cells. In one IC package, the RF power amplifier, the multi-band RF switch, a controller for controlling the switch and all connection therebetween are totally contained within the IC package. In another IC package, the RF power amplifier and the multi-band RF switch are disposed on a single substrate.

20 Claims, 17 Drawing Sheets

300

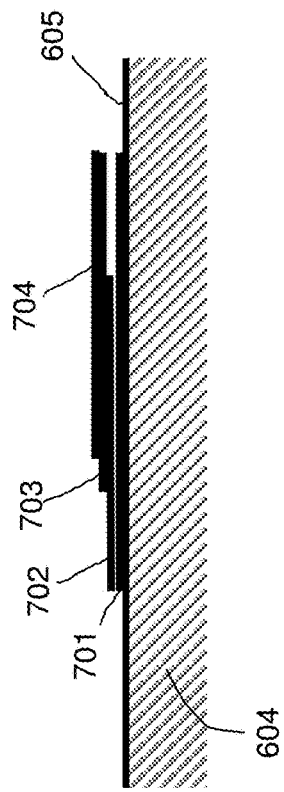
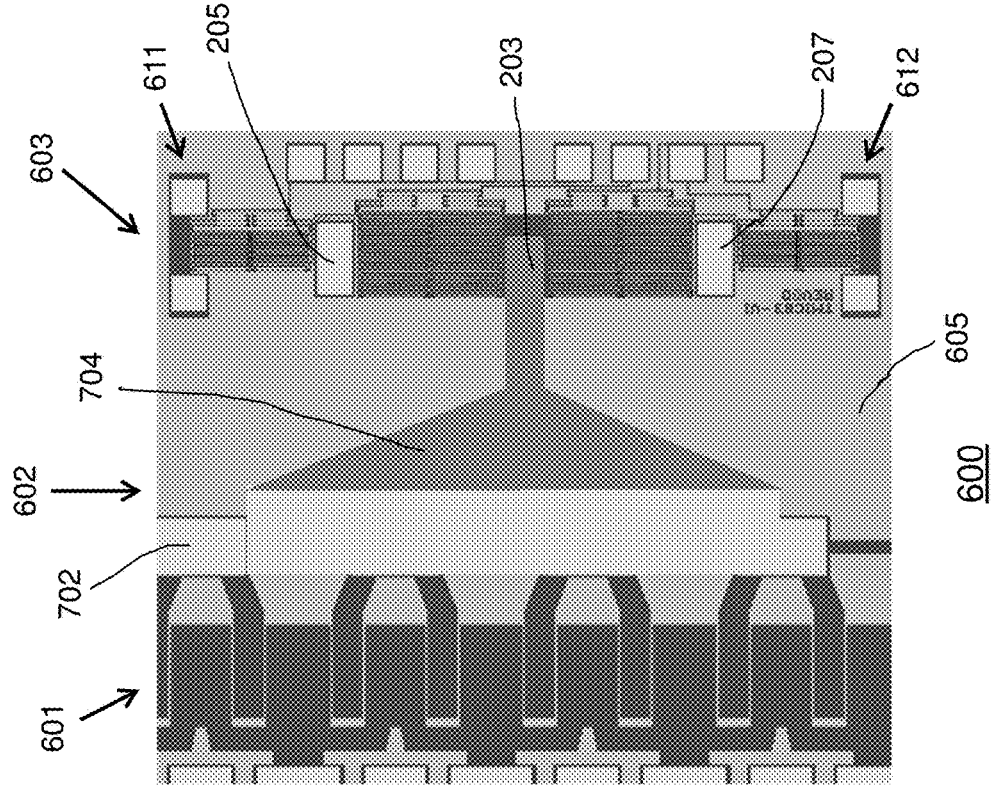
FIG. 7
FIG. 6

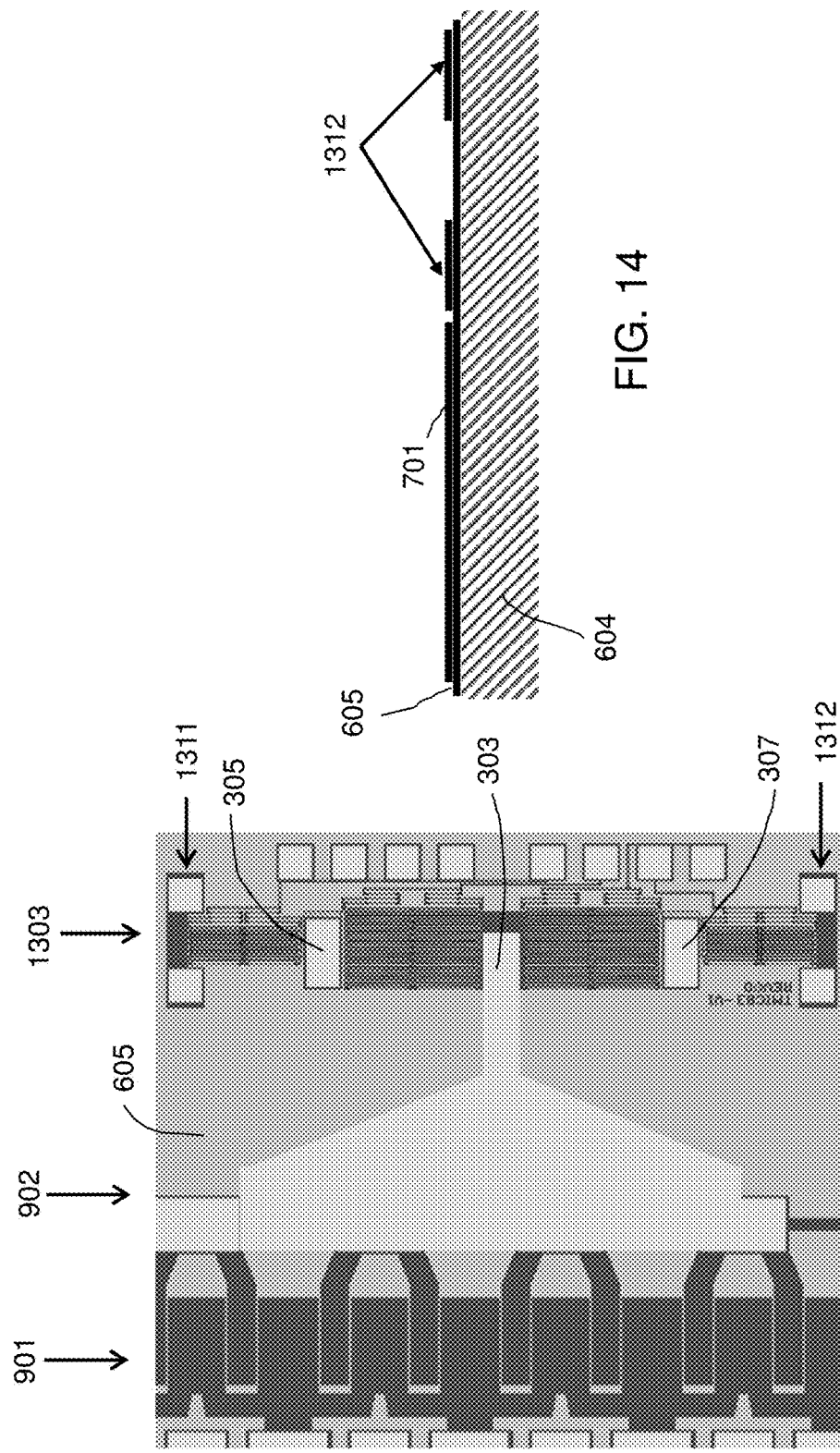

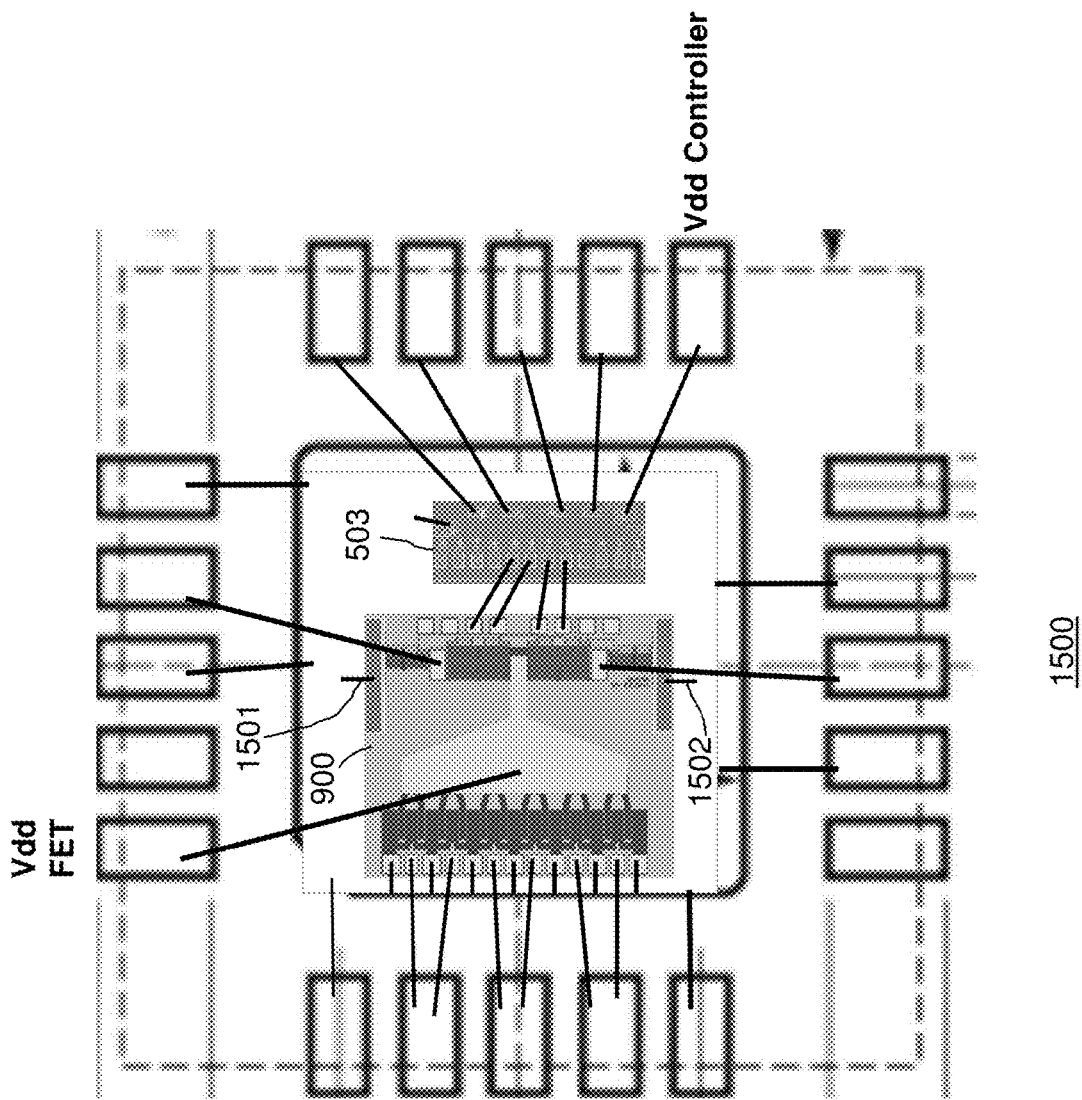

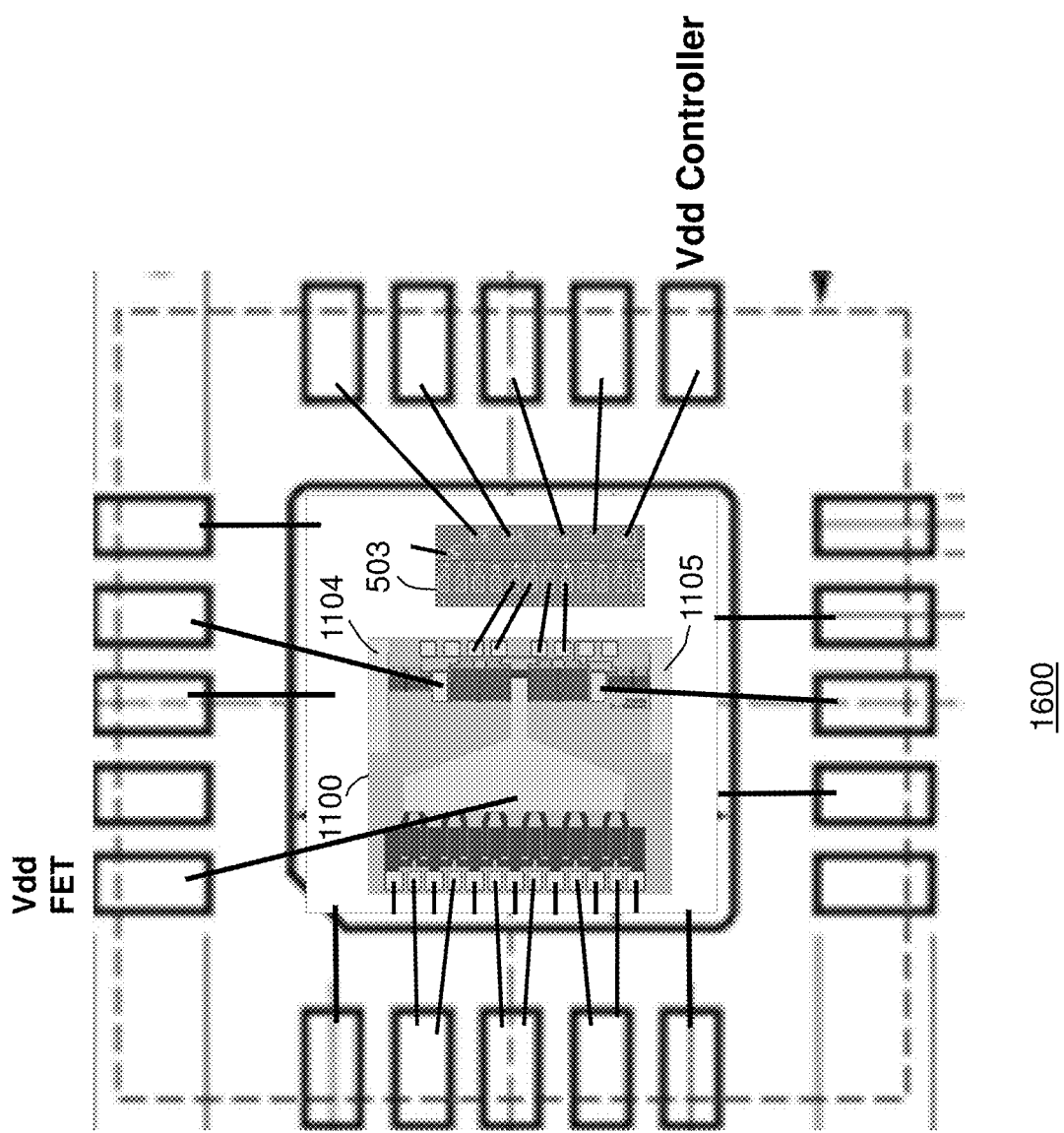

INTEGRATED GALLIUM NITRIDE POWER AMPLIFIER AND SWITCH

BACKGROUND

Field

This invention relates generally to active solid-state devices, and more specifically to a gallium nitride radio frequency power amplifier and a gallium nitride multi-band radio frequency switch.

Related Art

A gallium nitride (hereinafter "GaN") high-electron-mobility transistor (hereinafter "HEMT") is a depletion mode device, which is normally on, that may be used as a switch.

FIG. 1 is a simplified schematic of a known multi-band power amplifier circuit 100 comprising a radio frequency (hereinafter "RF") power amplifier and a multi-band RF switch 102. The RF power amplifier (hereinafter also referred to as "PA") comprises at least one field-effect transistor (hereinafter "PA-FET") 104. The multi-band RF switch 102 includes a plurality of FETs. The known multi-band power amplifier circuit 100 also comprises a controller 106 that controls operation of the multi-band RF switch 102.

The multi-band power amplifier circuit 100 includes a transformer 106 between the PA-FET 104 and the multi-band RF switch 102. The transformer acts as a wideband matching network. The transformer 106 is typically a transmission line transformer. For practical construction purposes, the transformer 106 typically transforms 12.5Ω to 50Ω. The transformer 106 could also be a lumped-element matching network. The transformer 106 is needed because an optimum load impedance of the PA-FET 104 is not 50Ω. The optimum load impedance of the PA-FET 104 is approximately 30Ω. The transformer 106 transforms an impedance (usually 30Ω) seen at a drain terminal of the PA-FET 104 to an impedance (usually 50Ω) needed to optimally drive filters 111 and 112 and an antenna (not shown) at each PA_Out port 121 and 122. There is no reference impedance associated with the switch 102. The presence of the transformer 106 prevents a direct connection between the PA-FET 104 and the multi-band RF switch 102. Disadvantageously, the transformer 106 is physically large, because it usually consists of multiple transmission lines which must be surrounded by magnetic material, or be at least approximately ⅛ wavelength at the lowest operating frequency. As a result of its large size, the transformer 130 cannot be housed in an IC package, such as an IC package (not shown) that houses the PA-FET 104 or an IC package (not shown) that houses the multi-band RF switch 102. Consequently, any indirect connection between the PA-FET 104 and the multi-band RF switch 102 must disadvantageously exist at least partially outside all known IC packages within which the PA-FET and the multi-band RF switch may be mounted.

A capacitor 108 is coupled between the drain of the PA-FET 104 and an input terminal of the transformer 106. The capacitor 108 prevents a DC voltage of a power supply from appearing at circuitry coupled to an output terminal of the transformer 106, which circuitry could contain paths to ground that would draw unnecessary current from the DC supply. The capacitor 108 may not be present if the transformer element provides its own DC isolation function.

The multi-band RF switch 102 is coupled between the transformer 106 and a plurality of filters 111 and 112 and selectively couples an output of the transformer to one of the plurality of filters. The filters 111 and 112 are typically lowpass or bandpass filters and are used to prevent harmonic and spurious signals outside a selected frequency band from reaching a PA_Out port 121 and a PA_Out port 122. Each filter 111 and 112 is tuned to pass a specific range of frequencies, as required by a radio system that uses the known multi-band power amplifier circuit 100.

A low power RF signal is applied to a PA_In port 124 which is coupled to an input port of an input matching circuit 126. Typically, the input matching circuit 126 comprises lumped elements. The input matching circuit 126 transforms an impedance (usually 50Ω) seen at the PA_In port 124 to a range of impedances needed to optimally drive a gate of the PA-FET 104 across the operating frequency range of PA 100. An output port of the input matching circuit 126 also provides a direct current (hereinafter "DC") bias to the gate of the PA-FET 104.

A DC supply voltage is applied to a DC_In port 128. An inductor 130 is coupled between the DC_In port 128 and the drain of the PA-FET 104. An amplified RF voltage appears at the drain of the PA-FET 104. The inductor 130 isolates the RF voltage at the drain of the PA-FET 104 from the DC supply voltage so that a very low impedance of the DC power supply does not affect the amplified RF voltage.

The multi-band RF switch 102 can be one of many multi-band RF switches available from various manufacturers. The multi-band RF switch 102 shown in FIG. 1 is an SP2T switch; however, the switch can have a plurality of output ports. In general, a number of output ports of the multi-band RF switch 102 must equal a number of amplified RF output paths of the multi-band power amplifier circuit 100.

All known multi-band power amplifier circuits that operate at frequencies below 2 GHz include a transformer, such as transformer 106. Disadvantageously, the transformer 106 of the multi-band power amplifier circuit 100 is physically large, because it usually consists of multiple transmission lines which are surrounded by magnetic material, or be at least approximately ⅛ wavelength at the lowest operating frequency. The transformer 106 of the known multi-band power amplifier circuit 100 is typically 1.2 cm by 2.5 cm. As a result of its large size, the transformer 130 cannot be housed in an IC package, such as an IC package (not shown) that houses the PA-FET 104 or an IC package (not shown) that houses the multi-band RF switch 102. Consequently, any indirect connection between the PA-FET 104 and the multi-band RF switch 102 must disadvantageously exist at least partially outside all known IC packages in which the PA-FET is housed and must disadvantageously exist at least partially outside all known IC packages in which the multi-band RF switch is housed.

In known implementations of the multi-band power amplifier circuit 100, the PA-FET 104 and the multi-band RF switch 102 are disposed on separate die. Additionally, in known implementations of the multi-band power amplifier circuit 100, the PA-FET 104 and the multi-band RF switch 102 are housed in separate IC packages.

In known implementations of the multi-band power amplifier circuit 100, the capacitor 108 is typically a chip capacitor. A chip capacitor must be located outside any IC package due to its large size. Therefore, in integrated circuit implementations of the multi-band power amplifier circuit 100, the capacitor 108 is located outside the IC package that houses the PA-FET 104 and outside the IC package that houses the multi-band RF switch 102.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 6 is a top view of a die that includes a power amplifier, a capacitor and a switch.

FIG. 7 is a side view of the capacitor shown the top view of FIG. 6.

FIG. 13 is a top view of a die that includes a power amplifier, an interconnect portion, and a switch with two ground terminals.

FIG. 14 is a side view of one of the two ground terminals shown FIG. 13.

FIG. 15 is a simplified diagram of a fourth integrated circuit package that includes, within the package, the die of FIG. 9 and a controller on another die.

FIG. 16 is a simplified diagram of a fifth integrated circuit package that includes, within the package, the die of FIG. 11 and a controller on another die.

DETAILED DESCRIPTION

A high-power, high-voltage multi-band RF power amplifier circuit includes a RF power amplifier coupled to a multi-band RF switch. The RF power amplifier is coupled to the multi-band RF switch without an intervening impedance matching network between the RF power amplifier and the multi-band RF switch.

Figure 2:
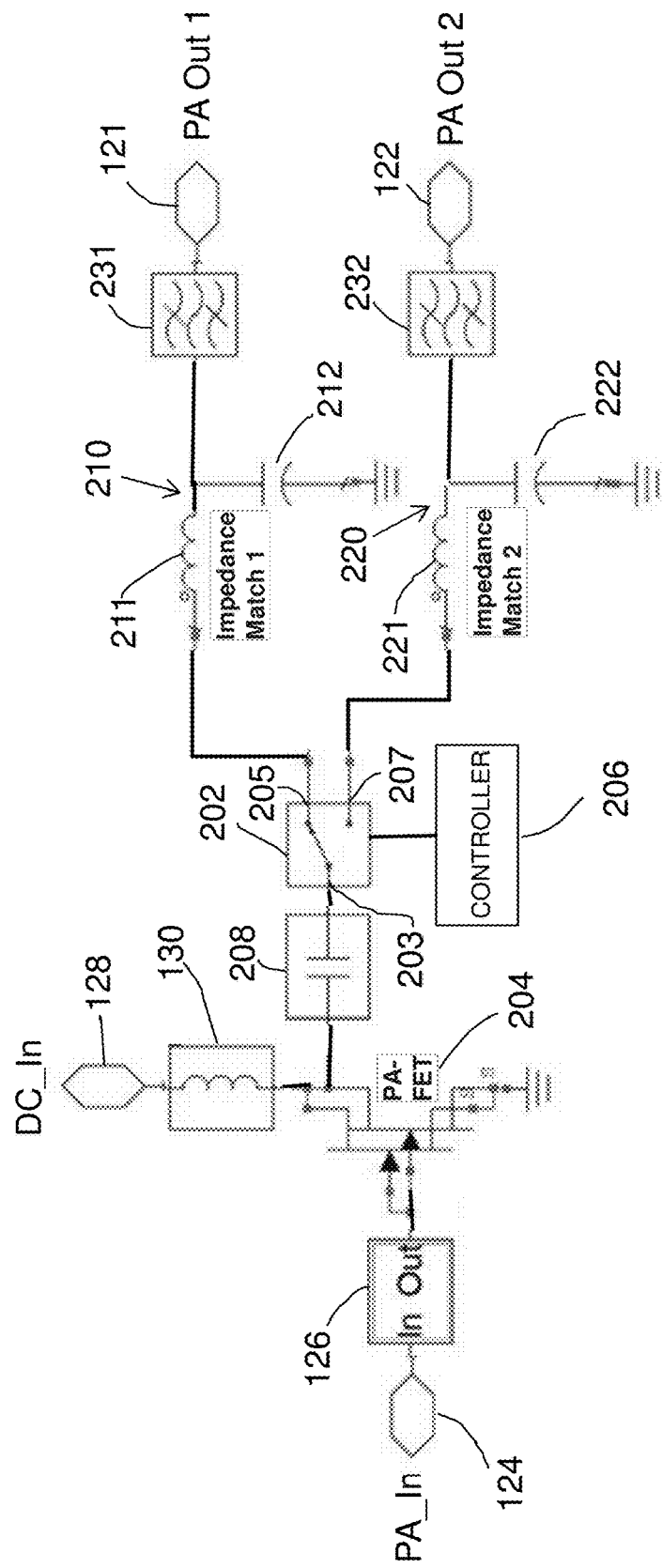
FIG. 2 is a simplified schematic of a multi-band power amplifier circuit in accordance with one embodiment of the invention.

FIG. 2 is a simplified schematic of a multi-band power amplifier circuit 200 in accordance with one embodiment of the invention. The multi-band power amplifier circuit 200 comprises a RF power amplifier and a multi-band RF switch (hereinafter "switch") 202. The RF power amplifier comprises at least one GaN FET (hereinafter "PA-FET") 204. The power amplifier usually comprises a plurality of individual GaN FETs connected in parallel, as required to produce a desired output power level; however, for simplicity of illustration only a single GaN FET is shown. The switch 202 comprises a plurality of GaN HEMTs arranged as Unit HEMT cells. The switch 202 includes a common RF port 203. The switch 202 is shown in more detail in FIG. 18. The multi-band power amplifier circuit 200 also comprises a controller 206 that controls operation of the switch 202. Controller 206 is shown in more detail in FIG. 18. The PA-FET 204 is coupled to the common RF port 203 of the switch 202 through a capacitor 208.

The term "high-power" means power at the output of the RF power amplifier of approximately 10 W or higher. The term "high-voltage" means a DC voltage at a drain of the PA-FET 204 and at the input of the switch 202 of approximately 30V or higher.

Figure 1:
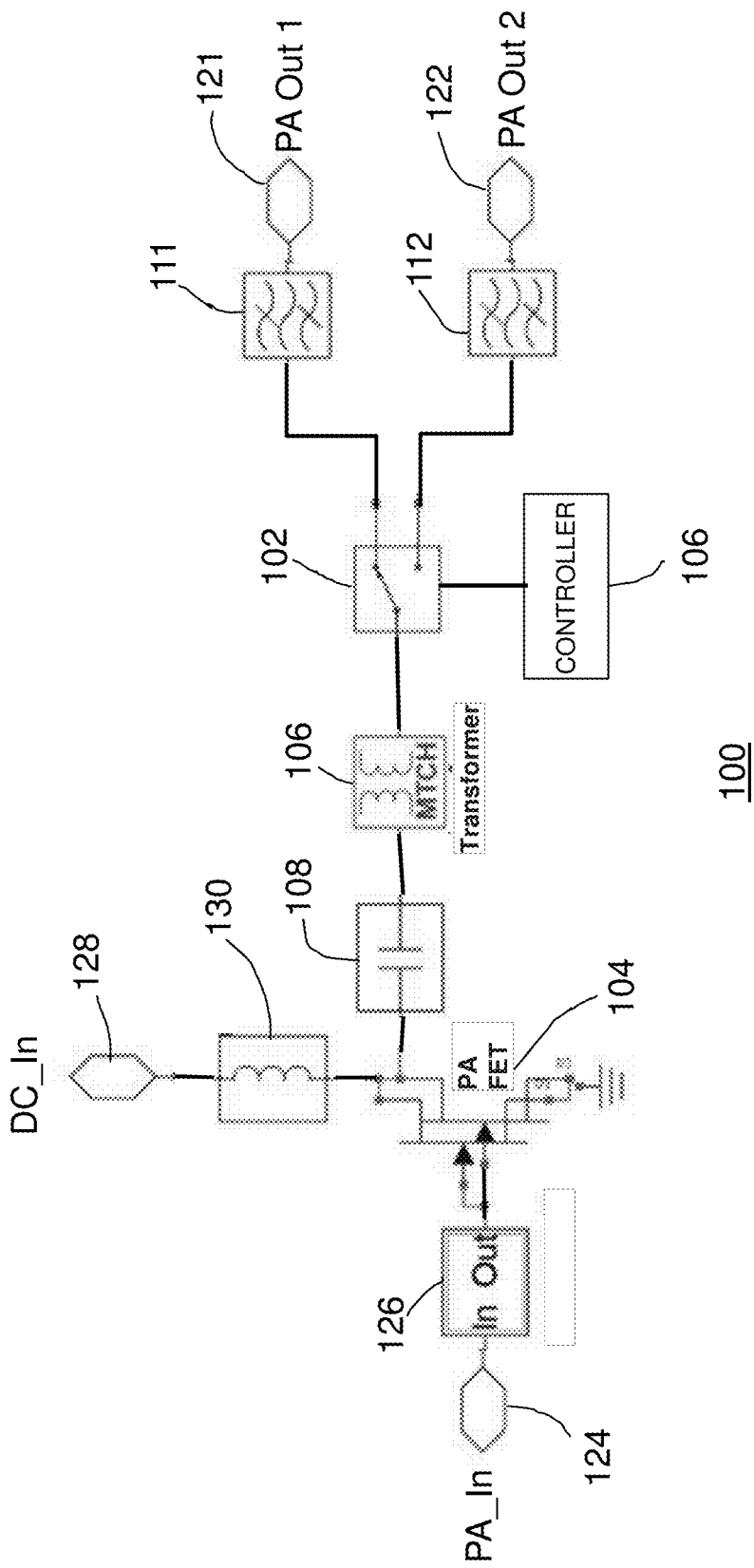
FIG. 1 is a simplified schematic of a known multi-band power amplifier circuit.

Advantageously, the multi-band power amplifier circuit 200 lacks the transformer 106 of the known multi-band power amplifier circuit 100. The multi-band power amplifier circuit 200 comprises narrowband impedance matching networks 210 and 220 coupled between the switch 202 and filters 231 and 232. The narrowband impedance matching networks 210 and 220 functionally replace the wideband transformer 106 of the known multi-band power amplifier circuit 100 shown in FIG. 1. The narrowband impedance matching networks (hereinafter "impedance matching networks") 210 and 220 are typically implemented using a few small, low cost, passive chip components that are mounted on a printed circuit (hereinafter "PC") board (not shown).

The impedance matching networks 210 and 220 are used to transform an impedance (typically 30Ω) necessary to obtain a required output power from the PA-FET 204 to an input impedance (usually 50Ω) of each filter 231 and 232 after accounting for losses in a corresponding path within the switch 202. Each narrowband impedance matching network 210 and 220 is configured for optimum impedance matching within a narrow RF band. In FIG. 2, impedance matching network 210 is shown as a single inductor 211 and a single capacitor 212 and impedance matching network 220 is shown as a single inductor 221 and a single capacitor 222 for simplicity of illustration; however, each impedance matching network can comprise multiple inductor-capacitor sections and/or transmission line segments as needed to obtain a required impedance transformation across a required frequency range. An impedance matching network that comprises a transmission line segment is too large to be housed within an IC package. In one embodiment, each impedance matching network 210 and 220 consists of a three pole to six pole filter.

In one embodiment, the impedance matching networks 210 and 220 are built on a PC board external to one of the PA-switch-controller ICs described hereinbelow (see FIGS. 4, 5, 8 and 15-17). In another embodiment, the impedance matching networks 210 and 220 are housed within any of the PA-switch-controller IC packages described hereinbelow (see FIGS. 4, 5, 8 and 15-17). In still another embodiment, the impedance matching networks 210 and 220 are integrated onto one of the PA-switch die described hereinbelow (see FIGS. 6, 9, 11 and 13). These higher levels of integration are used at higher frequencies, where the sizes of the components of the impedance matching networks 210 and 220 become small enough to permit such integration. Although only two impedance matching networks 210 and 220 are shown in FIG. 2, there would be N impedance matches to correspond with the N output paths from an SPNT switch.

Filters 231 and 232 are typically lowpass or bandpass RF filters used to prevent harmonic and spurious signals outside a selected frequency band from reaching a PA_Out port 121 and a PA_Out port 122. Each filter 231 and 232 is tuned to pass a specific range of frequencies, as required by a radio system that uses the multi-band power amplifier circuit 200. Each filter 231 and 232 is configured to pass only RF signals within the narrow RF band of the narrowband impedance matching network 210 and 220 to which it is coupled. For simplicity of illustration, only two filters 231 and 232 are shown; however, the multi-band power amplifier circuit 200 includes more than two filters when the multi-band power amplifier circuit has more than two output paths. In general, the number of filters equals the number of output paths of the multi-band power amplifier circuit 200. For example, when the multi-band power amplifier circuit 200 includes three (3) output paths, filter 231 is tuned to a range of approximately 740-870 MHz, filter 232 is tuned to a range of approximately 380-520 MHz and a third filter (not shown) is tuned to a range of approximately 130-175 MHz. In one embodiment, the impedance matching networks 210 and 220 are integrated into the filters 231 and 232.

A capacitor 208 is coupled between the drain of the PA-FET 204 and a common RF port, or input terminal, of the switch 202. The capacitor 208 prevents a DC supply voltage from appearing at the switch 202 which could, in one embodiment of the switch, contain paths to ground that would draw unnecessary current from a DC supply. In FIG. 2, the capacitor 208 is a flat metal-insulator-metal (MIM) capacitor that is mounted inside one of the PA-switch-controller IC packages described hereinbelow (see FIGS. 4, 5, 8 and 15-17). In one embodiment, the MIM capacitor 208 is integrated onto the PA-FET die, onto the switch die, or onto a combined PA-FET-switch die of one of the PA-switch-controller IC packages described hereinbelow (see FIGS. 4, 5, 8 and 15-17) when the fabrication process used to make these die supports a MIM capacitor with sufficient capacitance and breakdown voltage to function reliably in the multi-band power amplifier circuit 200 across the required frequency range.

The switch 202 may have larger FETs than the known multi-band RF switch 104 has so that the switch 202 can handle a higher RF current present at the output of the PA-FET 204. In one embodiment, the switch 202 is a model TS7423L switch available from Tagore Technology, Inc., of Arlington Heights, Ill. An SP2T switch is shown in FIG. 2, but the switch 202 could also be a multi-port RF switch, such as a model TS7341L switch also available from Tagore Technology, Inc. In general, the switch 202 is an SPNT switch, where N is the number of output ports of the switch. The number of output ports of the switch must equal a number of amplified RF output paths of the multi-band power amplifier circuit 200.

The RF signals from the PA_Out ports 121 and 122 may be directly connected to separate antennas (not shown) tuned for each frequency range. Alternatively, each PA_Out port 121 and 122 may be connected to the inputs of an additional switch (not shown) which connects a selected PA_Out port to an antenna that can operate in multiple frequency ranges. The additional switch can also contain an extra port that is connected to an RF input of a receiver.

A DC supply voltage is applied to the DC_In port 128. In one embodiment, the DC supply voltage is +28V. The drain of the PA-FET is biased at +28V.

Figure 3:
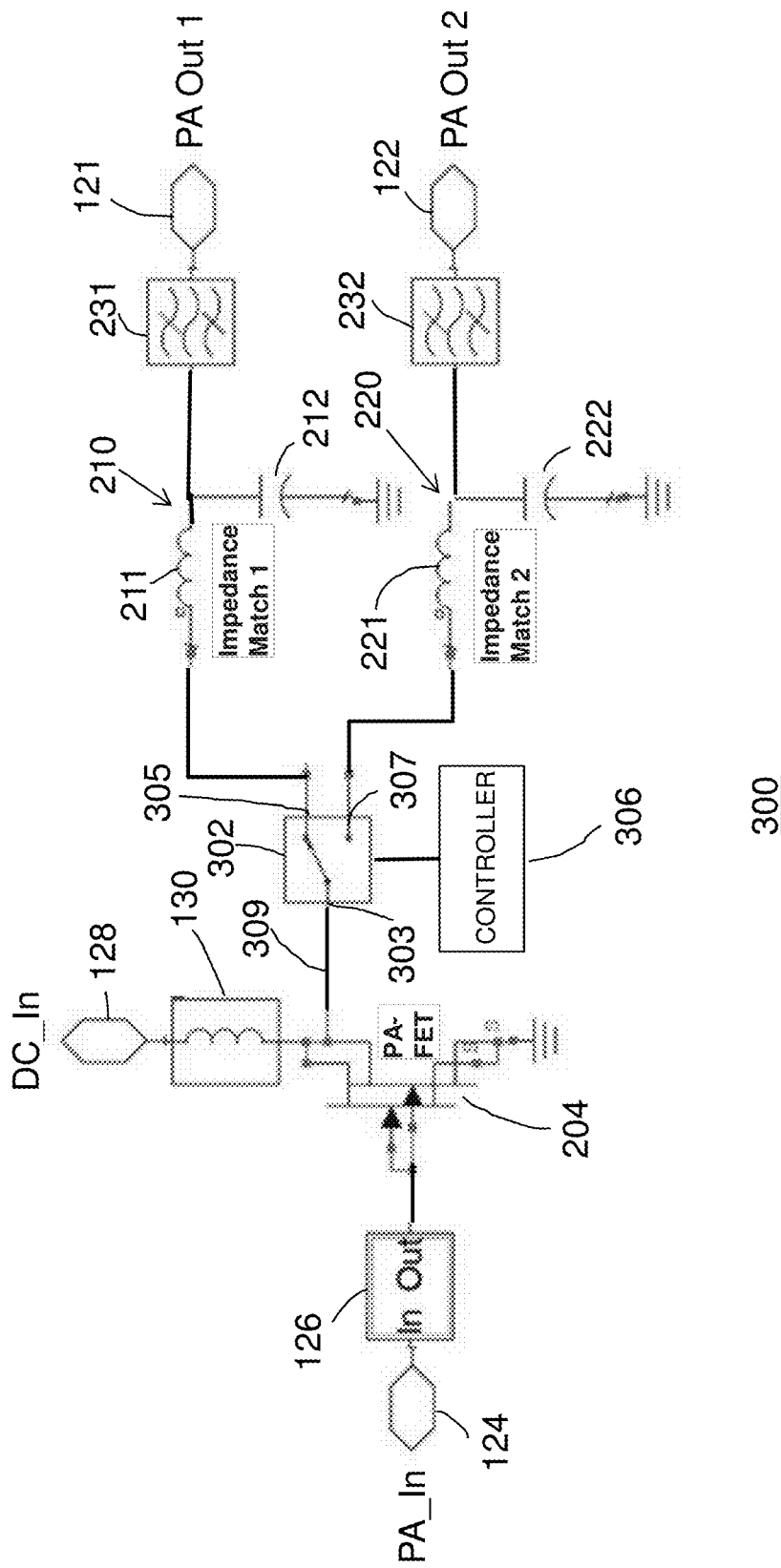
FIG. 3 is a simplified schematic of a multi-band power amplifier circuit in accordance with another embodiment of the invention.

FIG. 3 is a simplified schematic of a multi-band power amplifier circuit 300 in accordance with another embodiment of the invention. In the multi-band power amplifier circuit 300, the PA-FET 204 is connected directly to a multi-band RF switch (hereinafter "switch") 302. The switch 302 includes a common RF port 303. Except for the absence of the DC blocking capacitor 208, which is replaced by a conductor 309, the substitution of switch 202 with switch 302, and the substitution of controller 206 with controller 306, the multi-band power amplifier circuit 300 of FIG. 3 is otherwise similar to the multi-band power amplifier circuit 200 of FIG. 2; therefore, the multi-band power amplifier circuit 300 will not be described in further detail. Switch 302 and controller 306 are shown in more detail in FIG. 19. The direct connection (without an intervening capacitor) between the drain of the PA-FET 204 and the common RF port 203 of the switch 302 eliminates a need for negative bias on the gates of the FETs in the switch 302 (see FIG. 19). In the multi-band power amplifier circuit 300, the DC bias of the PA-FET 204, which is typically +28V to +50V, is directly applied to the GaN HEMTs of the switch 302. This means that the GaN HEMTs of the switch 302 can be turned off by simply grounding their gates (rather than applying a negative voltage to their gates), thus eliminating a need for an oscillator, a charge pump, and a negative voltage level shifter in a controller of the switch.

Figure 4:
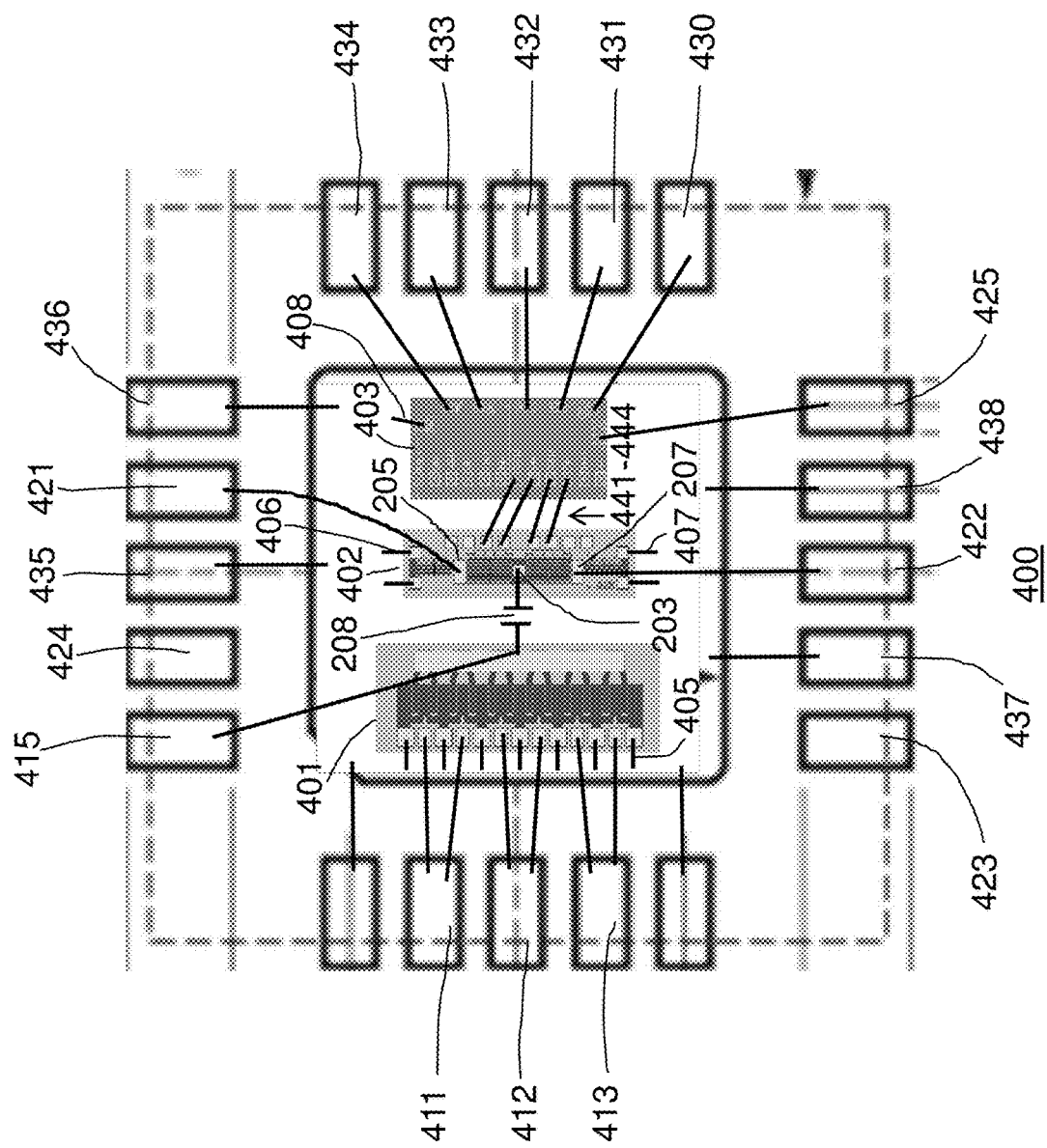
FIG. 4 is a simplified diagram of a first integrated circuit package that includes, within the package, a power amplifier on a first die, a switch on a second die and a controller on a third die.

FIG. 4 is simplified diagram of a first integrated (hereinafter "IC") circuit package 400 that includes, within the first IC package, a power amplifier on a die 401, a multi-band RF switch on a die 402 and a controller on a die 403. Die 401 and die 402 are GaN die. Die 403 is one of a GaN die and complementary metal-oxide-semiconductor (hereinafter "CMOS") die. A direct connection between the power amplifier, such as PA-FET 204 and the multi-band RF switch, such as switch 202 (through capacitor 208) is consistent with the schematic of FIG. 2. The direct connection between PA-FET 204 and switch 202 and their small sizes enables the PA-FET, the capacitor, the switch and the controller on die 403 to occupy a flat-pack no-lead package such as IC package 400. For example, in one embodiment, the PA-FET 204 is approximately 0.7 mm by 3.0 mm, the switch 202 is approximately 1.1 mm by 1.5 mm, and die 403 is approximately 0.7 mm by 1.5 mm. The PA-FET 204, which is on die 401, is connected to the common RF port 203 of the switch 202, which is on die 402, advantageously without any intervening wide-band impedance matching network such the transformer 106 of the known multi-band power amplifier circuit 100 shown in FIG. 1. At frequencies above approximately 2 GHz, the narrowband impedance matching networks 210 and 220 can also be housed in the first IC package 400. At frequencies above approximately 5 GHz, the filters 231 and 232 can also be housed in the first IC package 400. At frequencies above approximately 10 GHz, the inductor 130 can also be housed in the first IC package 400.

One end of line 405 is coupled to a source terminal of PA-FET 204. The other end of line 405 is coupled to a die attach pad (hereinafter "DAP") of the IC package 400. The other short, unterminated lines, e.g., lines 406, 407 and 408, of the IC package 400 are also coupled to the DAP of the IC package. Pins 435, 436, 437 and 438 of the IC package 400 are connected to the DAP. Pins 435, 436, 437 and 438 are typically connected to a ground terminal of a PC board.

The left edge of the IC package 400 contains three pins 411, 412 and 413 that are connected to gate terminals of PA-FET 204. The gate terminals of PA-FET 204 are typically connected to each other. The pins 411, 412 and 413 are also connected to the output port of the input matching circuit 126 shown in FIG. 2.

The top edge of the IC package 400 contains a pin 415 for receiving a DC voltage, DC_In, and pin 421 for outputting an amplified, switched RF signal. The pin 415 is coupled to the drain of the PA-FET 204. The DC_In port 128 shown in FIG. 2 is connected to pin 415 through the inductor 130 shown in FIG. 2.

The bottom edge of the IC package 400 contains a pin 422 for outputting an amplified, switched RF signal and a pin 423. The pin 421 and the pin 422 are coupled, respectively, to two RF outputs 205 and 207 of switch 202. Pin 423 and pin 424 are not connected to die 402, because the switch die contains a SP2T switch. Pins 423 and 424 are used when the die 402 contains a SP4T switch.

Figure 18:
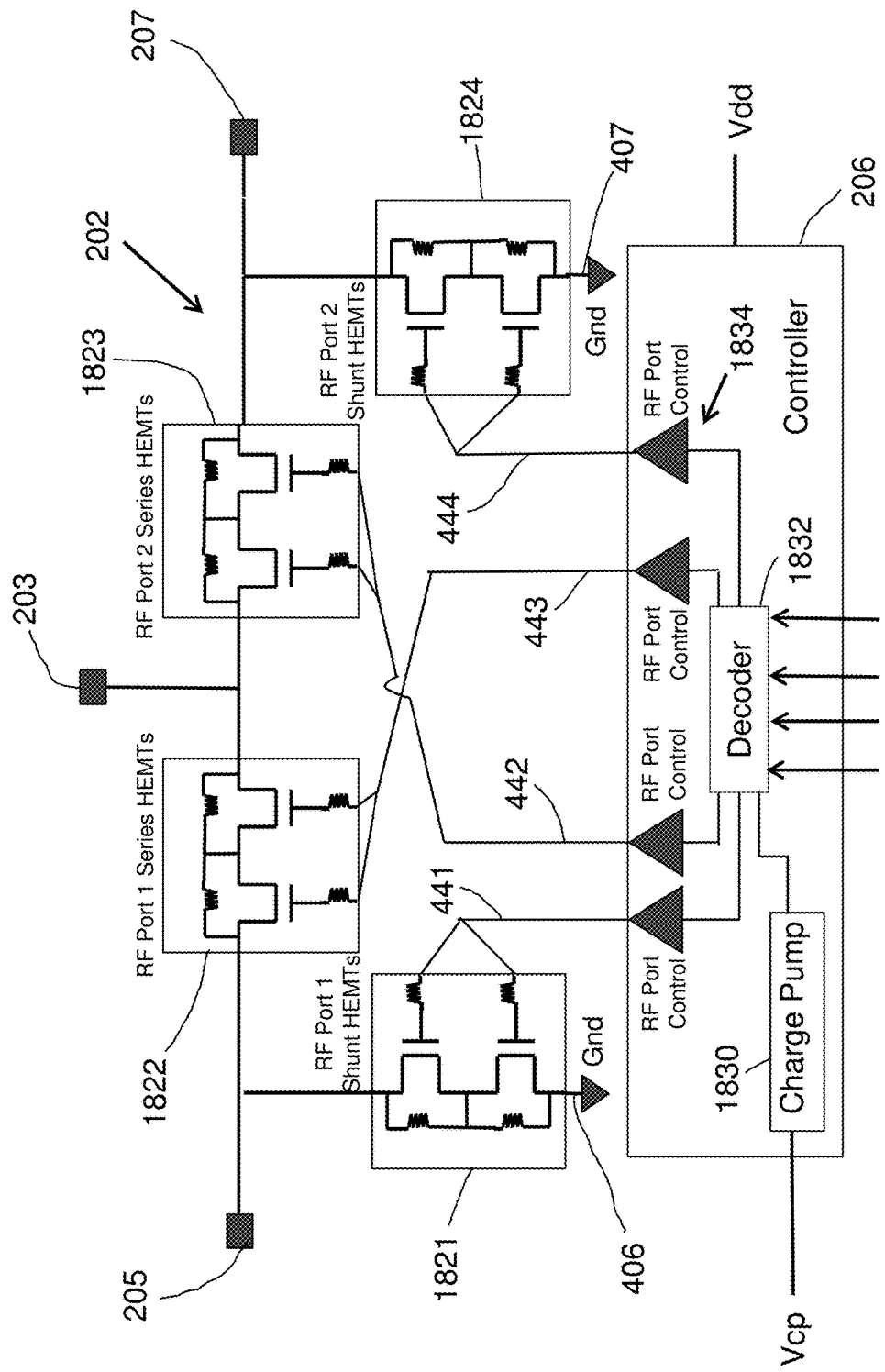
FIG. 18 is a simplified schematic of a SP2T switch coupled to a controller.

The controller of die 403 corresponds to controller 206 shown in the schematic of FIG. 2 as a simple block and shown in more detail in FIG. 18. Four control lines 441-444 connect the controller 206 to the switch 202. The controller 206 includes a charge pump 1830 (see FIG. 18). The bottom edge of the IC package 400 contains a pin 425 that is connected to die 403 and provides a charge pump voltage Vcp to the charge pump 1830. Pin 425 may be open or may be connected to a capacitor (not shown), on a PC board, to help stabilize Vcp. In one embodiment, pin 425 is connected to an external negative voltage supply when a charge pump is not present or is not capable of supplying a required current.

The right edge of the IC package 400 contains a pin 430 and four pins 431, 432, 433 and 434. Pin 430 is connected to die 403 and provides a $V_{DD}$ voltage (see FIG. 18) to the controller 206. Pins 431, 432, 433 and 434 are also connected to die 403 and provide logic signals to the controller 206. In one embodiment, the IC package 400 is in the form of a dual-flat no-lead ("DFN") package. In another embodiment, the IC package 400 is in the form of a quad-flat no-lead ("QFN") package.

Figure 5:
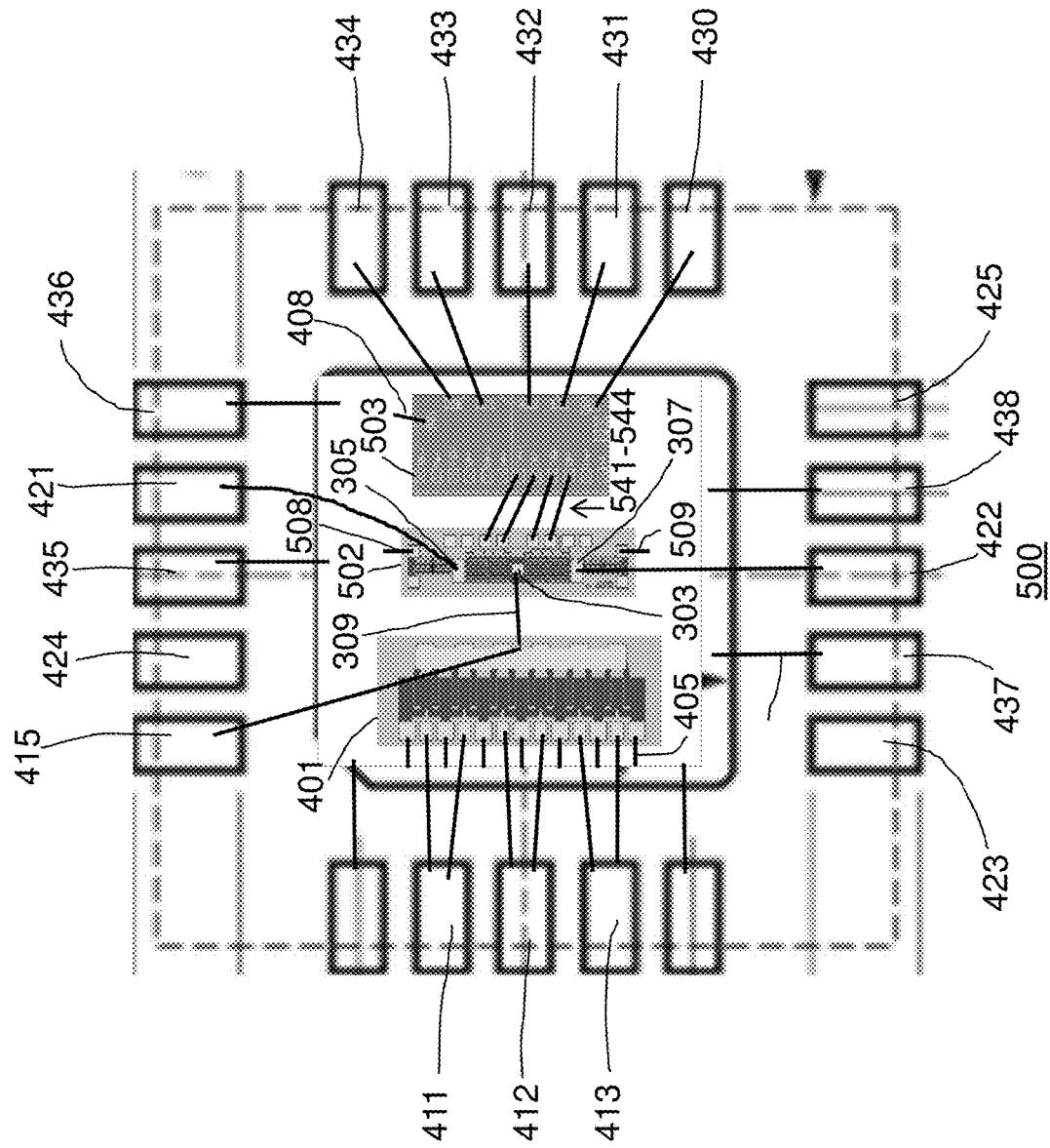
FIG. 5 is a simplified diagram of a second integrated circuit package that includes, within the package, a power amplifier on a first die, a switch on a second die and a controller on a third die.

FIG. 5 is a simplified diagram of a second IC package 500 that includes, within the second IC package, a power amplifier on a die 401, a multi-band RF switch on a die 502 and a controller on a die 503. The power amplifier, which is on die 401, is connected directly to the multi-band RF switch, which is on die 502, advantageously without any intervening impedance matching network such the transformer 106 of the known multi-band power amplifier circuit 100 shown in FIG. 1. In FIG. 5, a power amplifier, such as PA-FET 204, on die 401 is connected directly to a multi-band RF switch, such as switch 302, on die 502. A direct connection between the PA-FET 204 and the switch 302 through conductor 309 is consistent with the schematic of FIG. 3, and enables the PA-FET and the switch to both occupy the second IC package 500. The pin 421 and the pin 422 are coupled, respectively, to two RF outputs 305 and 307 of switch 302.

Figure 19:
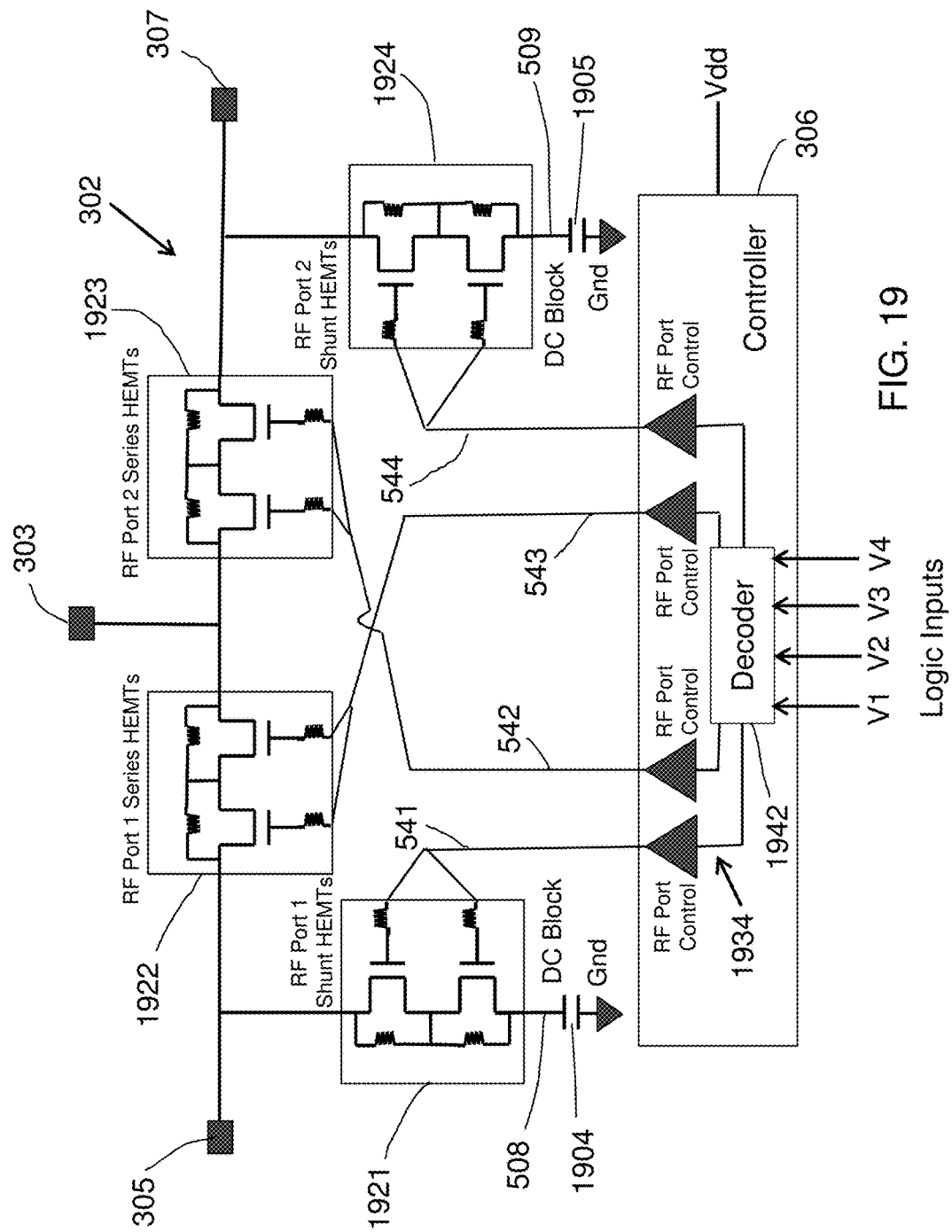
FIG. 19 is simplified schematic of another SP2T switch coupled to a controller in accordance with one embodiment of the invention.

The controller on die 503 corresponds to controller 306 shown in the schematic of FIG. 3 as a simple block and in more detail in FIG. 19. Four control lines 541-544 connect the controller 306 with the switch 302. Two lines 508 and 509 that are shown in FIG. 5 as emanating from die 503 are connected to capacitors 1904 and 1905 respectively (See FIG. 19). As shown in FIG. 19, the controller 306 does not include a charge pump; therefore, the controller on die 503 does not require a connection to pin 425. Except for the absence of the DC blocking capacitor 208, which is replaced by conductor 309, and the substitution of controller 206 with controller 306, the second IC package 500 of FIG. 5 is otherwise similar to the first IC circuit package 400 of FIG. 4; therefore, the second IC package 500 will not be described in further detail.

FIG. 6 is a top view of a die 600 that includes a power amplifier 601, an interconnect portion 602 and a switch 603 that are disposed in a GaN layer 605 on a semi-insulating silicon (Si) or silicon carbide (SiC) substrate (hereinafter "substrate") 604. In one embodiment, the power amplifier 601 corresponds to PA-FET 204 shown in the schematic of FIG. 2. In one embodiment, the interconnect portion 602 is a metal-insulator-metal (hereinafter "MIM") capacitor 710 (see FIG. 7) that functions as capacitor 208 shown in the schematic of FIG. 2 and shown in the first IC package 400 of FIG. 4. The die 600 includes two pairs of terminals 611 and 612 that are part of the switch 603. Lines 406 and 407 couple one terminal of each of each pair of terminals 611 and 612 to ground potential. Other lines (not shown) couple the other terminal of each of each pair of terminals 611 and 612 to ground potential. In one embodiment, the switch 603 corresponds to switch 202 shown as a simple block in FIG. 2 and in more detail in FIG. 18. Advantageously, the transistors of the switch 603 are made using the same technology as the one or more transistors of the power amplifier 601. In one embodiment, the HEMTs of the switch 603 and the one or more FETs of the power amplifier 601 are made using GaN technology. The drain of the one or more FETs of the power amplifier 601 is connected (through the interconnect portion 602) to a common RF port of the switch 603. A direct connection between the power amplifier 601 and the switch 603 (through the MIM capacitor 710) enables the power amplifier, the interconnect portion 602 and the switch 603 to be on the same GaN die. At frequencies above approximately 2 GHz, the narrowband impedance matching networks 210 and 220 can also be included on die 600. At frequencies above approximately 5 GHz, the filters 231 and 232 can also be included on die 600. At frequencies above approximately 10 GHz, the inductor 130 can also be included on die 600.

FIG. 7 is a side view of only the interconnect portion 602 of the die 600 shown in FIG. 6. The GaN layer 605 covers an entire top surface of the substrate 604. An insulating layer 701 covers a top surface of the GaN layer 605 at the interconnect portion 602 of the die 600. A lower metal layer 702 of the MIM capacitor 710 is disposed on the insulating layer 701 at the interconnect portion 602 of the die 600. An insulator layer 703 of the MIM capacitor is disposed on a portion of the lower metal layer 702. An upper metal layer 704 of the MIM capacitor 710 is disposed on a portion of the insulator layer 703. The insulating layer 701 exists between layers 702, 703 and 704 and the GaN layer 605, except where lower metal 702 contacts the drain of the PA-FET 601 and except where upper metal layer 704 contacts the common RF port 203 of switch 603. In one embodiment, the insulating layer 701 is composed of one of silicon dioxide ($SiO_2$) and silicon nitride ($Si_3N_4$).

Figure 8:
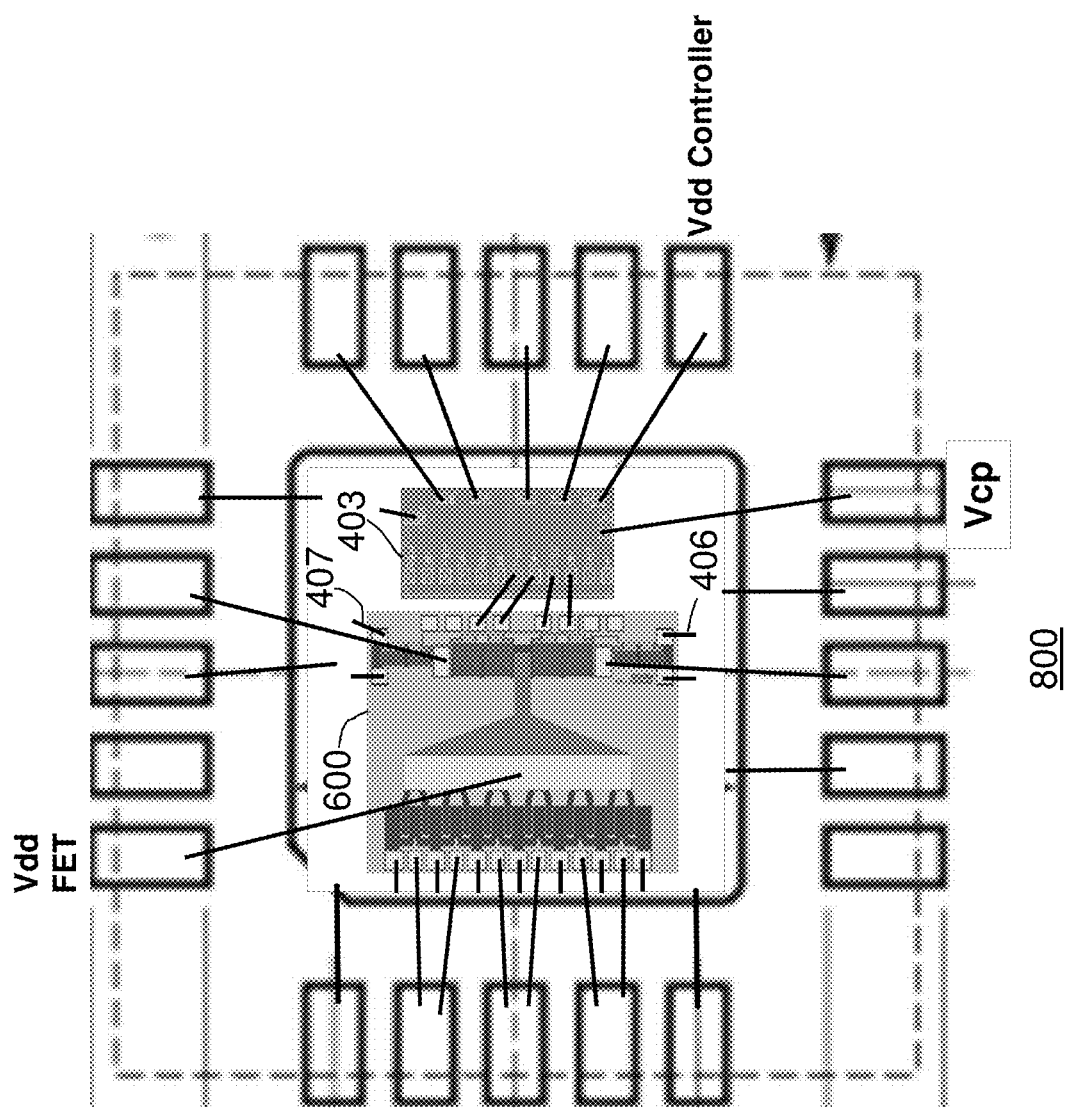
FIG. 8 is a simplified diagram of a third integrated circuit package that includes, within the package, the die of FIG. 6 and a controller on another die.

FIG. 8 is a simplified diagram of a third integrated circuit package 800 that includes, within the package, die 600 and a controller on die 403. Except that die 401, capacitor 208 and die 402 are replaced by die 600, the third IC package 800 of FIG. 8 is otherwise similar to the first IC circuit package 400 of FIG. 4; therefore, the third IC package 800 will not be described in further detail.

Figure 9:
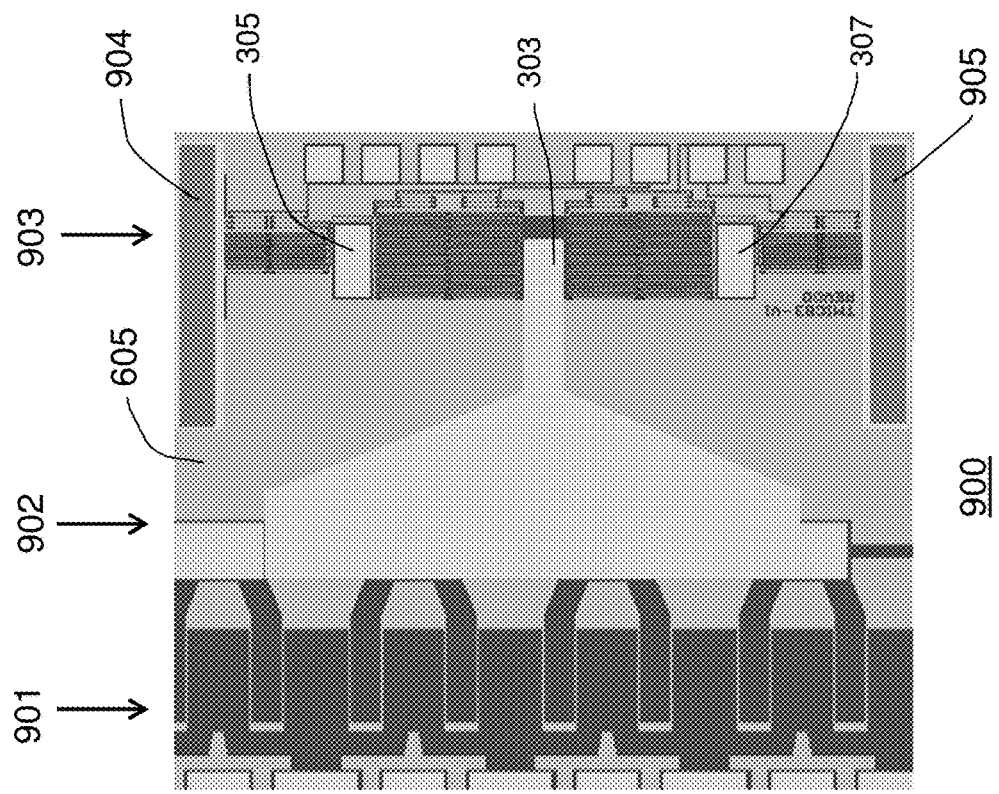
FIG. 9 is a top view of a die that includes a power amplifier, an interconnect portion and a switch with two capacitors.
Figure 11:
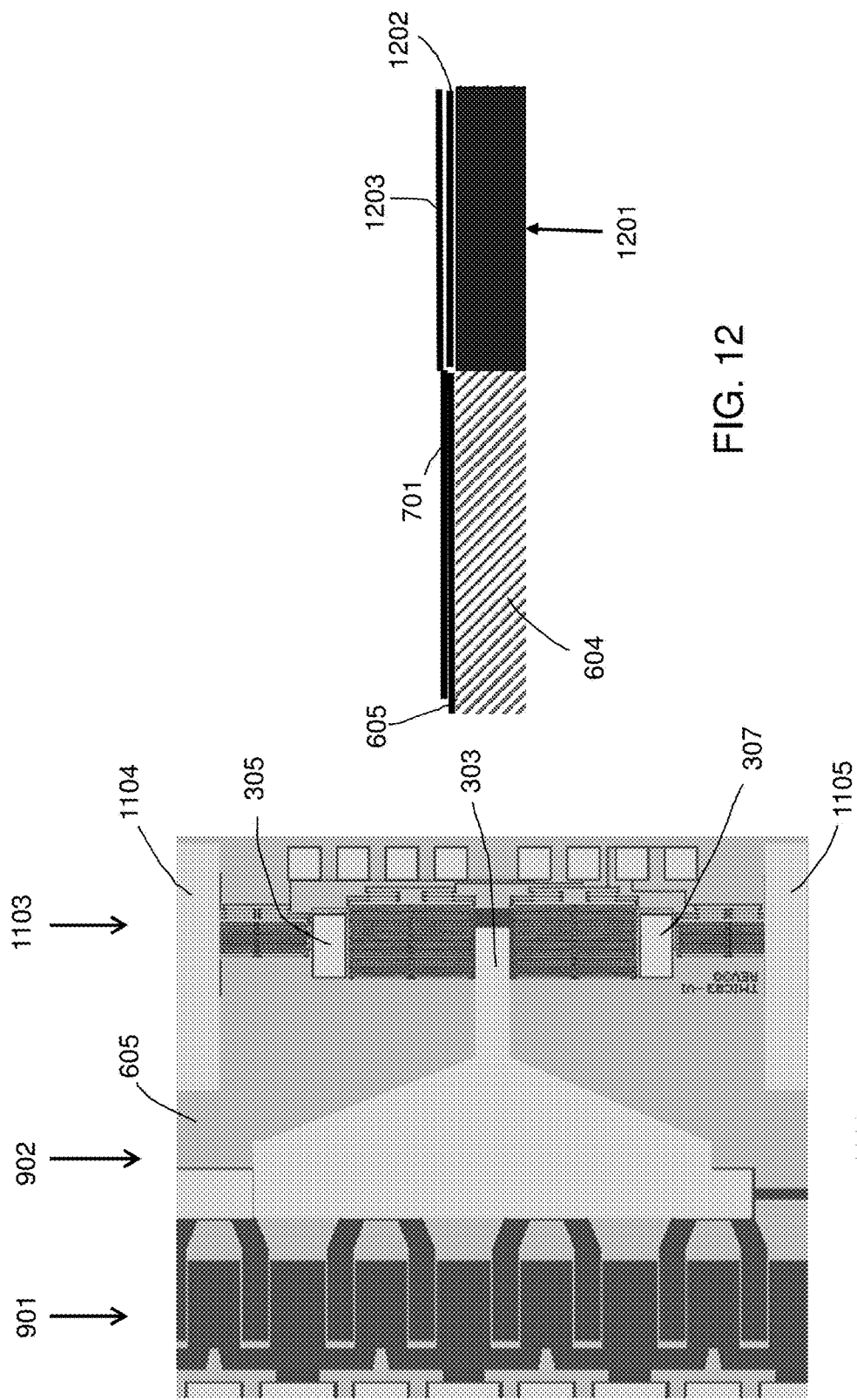
FIG. 11 is a top view of a die that includes a power amplifier, an interconnect portion, a switch with two capacitors.

In FIGS. 9, 11 and 13, the common terminal 303 of the switch 903, 1103 and 1303 is connected directly to the drain of PA-FET 204 without any intervening DC Block. This allows the entire switch to float at the average voltage at the drain of the PA-FET, which is the same as the Vdd FET voltage. The advantage of this arrangement is that it is no longer necessary for the controller 306 to contain a negative bias generator or charge pump. Instead, the gates of the switch 903, 1103 and 1303 can simply be grounded (through an appropriate resistor) by the controller 306, thus reducing size and complexity of controller.

FIG. 9 is a top view of a die 900 that includes a power amplifier 901, an interconnect portion 902, and a switch 903 that are disposed on the substrate 604. The power amplifier 901 corresponds to PA-FET 204 shown in the schematic of FIG. 3. The interconnect portion 902 corresponds to conductor 309 shown in the schematic of FIG. 3 and in the second IC package 500 of FIG. 5. The switch 903 includes two MIM capacitors 904 and 905. The switch 903 corresponds to switch 302 shown in the schematic of FIG. 3 as a simple block and in more detail in FIG. 19. The MIM capacitors 904 and 905 correspond to capacitors 1904 and 1905 shown in FIG. 19. In FIG. 9, the DC Blocks are the MIM capacitors 904 and 905 placed between the terminals of the shunt Unit HEMT cell 1921 and 1922 (terminals that would otherwise be connected to ground), and the ground bond wires 1501 and 1502 (see FIG. 15) respectively which are connected to ground.

Figure 10:
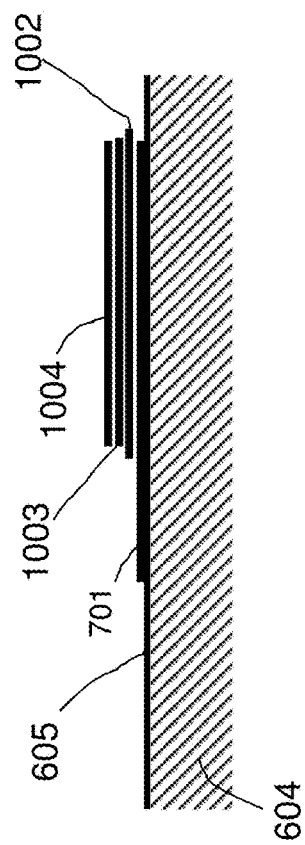
FIG. 10 is a side view of one the two capacitors shown in FIG. 9.

FIG. 10 is a side view of one of the two MIM capacitors 904 and 905 shown in the top view of die 900. A lower metal 1002 of one of the two MIM capacitors 904 and 905 is disposed on the insulating layer 701, an insulator 1003 of one of the two the MIM capacitors is disposed on the lower metal, and an upper metal 1004 of one of the two MIM capacitors is disposed on the insulator.

FIG. 11 is a top view of a die 1100 that includes the power amplifier 901, the interconnect portion 902, and a switch 1103 that are disposed on the substrate 604. Switch 1103 includes two metal-oxide-semiconductor (hereinafter "MOS") capacitors 1104 and 1105. The MOS capacitors 1104 and 1105 correspond to capacitors 1904 and 1905 shown in FIG. 19. Switch 1103 of FIG. 11 is similar to switch 903 of FIG. 9 except that the construction of MOS capacitors 1104 and 1105 is different from the construction of MIM capacitors 904 and 905. In FIG. 11, the DC Blocks are MOS capacitors 1104 and 1105 placed under the terminals of the shunt Unit HEMT cell 1921 and 1922 (terminals that would otherwise be connected to ground). In FIG. 11, there are no ground bond wires on these terminals, as shown in FIG. 16. The configuration shown in FIG. 11 requires the ability to selectively dope the silicon for high conductivity under the insulator.

Figure 12:
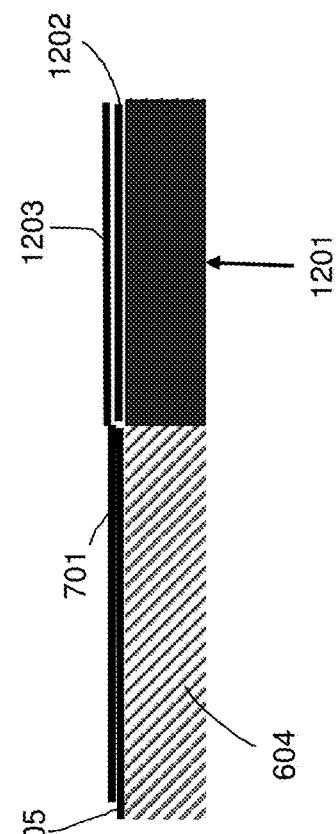
FIG. 12 is a side view of one the two capacitors shown in FIG. 11.

FIG. 12 is a side view of one of the two MOS capacitors 1104 and 1105 shown in the top view of die 1100. Substrate 604 includes an area of highly conductive silicon 1201. The area of the highly conductive silicon 1201 acts as a path to ground. The ground plate of each MOS capacitor 1104 and 1105 is the area of the highly conductive silicon 1201. One method of fabricating the MOS capacitors 1104 and 1105 is to highly dope the silicon of the substrate 604 of the die 1100 in the regions of the MOS capacitors 1104 and 1105 to produce the area of highly conductive silicon 1201. Then, depositing one or more GaN layers 605 and insulating layer 701 over the one or more GaN layers. Then, etching away the insulating layer 701 and the one or more GaN layers 605 in the regions of the MOS capacitors 1104 and 1105. Then, a suitable dielectric such as insulator 1202 is disposed over the area of highly conductive silicon 1201. Then, a top metal 1203 is disposed over the insulator 1202 thereby forming capacitors 1104 and 1105. In another method of fabricating the MOS capacitors 1104 and 1105, the area of highly conductive silicon is produced by etching away the one or more GaN layers 605 in the regions of the MOS capacitors 1104 and 1105, and masking the one or more GaN layers 605 in other regions to protect them while implanting dopants into the silicon of the exposed substrate 604. Then, insulator 1202 is disposed over the area of highly conductive silicon 1201. Then, a top metal 1203 is disposed over the insulator 1202 thereby forming capacitors 1104 and 1105.

FIG. 13 is a top view of a die 1300 that includes the power amplifier 901, the interconnect portion 902, and a switch 1303 that are disposed on the substrate 604. The die 1300 includes two pairs of terminals 1311 and 1312 that are part of switch 1303. Each pair of terminals 1311 and 1312 is represented as one terminal in FIG. 19.

FIG. 14 is a side view of one pair of ground terminals 1312 shown in the top view of the die 1300. Each ground terminal of the pair of ground terminals 1312 comprises a metal layer disposed on the GaN layer 605. As shown in FIG. 14, the insulating layer 701 is removed in the area under the pair of ground terminals 1312.

FIG. 15 is a simplified diagram of a fourth integrated circuit package 1500 that includes, within the package, die 900 and a controller 306 on die 403. Line 1501 couples MIM capacitor 904 to ground. Line 1502 couples MIM capacitor 905 to ground. Vcp is not used in the fourth integrated circuit package 1500 because the controller 306 on die 503 does not include a charge pump.

FIG. 16 is a simplified diagram of a fifth integrated circuit package 1600 that includes, within the package, die 1100 and controller 306 on die 503. The switch on die 1100 includes MOS capacitors 1104 and 1105. There are no ground wires connecting MOS capacitors 1104 and 1105 to ground because grounding of each MOS capacitor is accomplished within die 1100. Vcp is not used in the fifth integrated circuit package 1600 because the controller 306 on die 503 does not include a charge pump.

Figure 17:
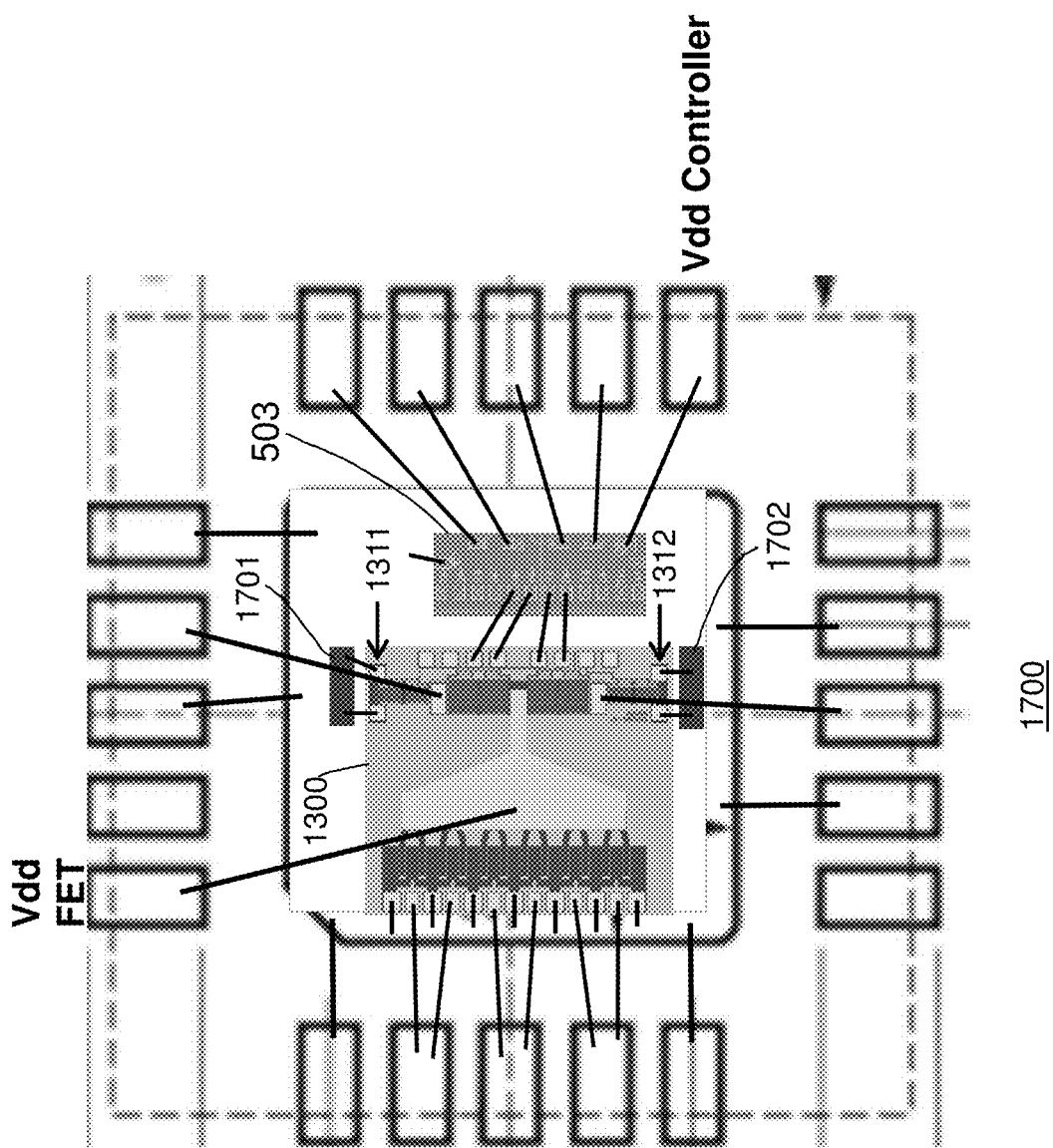
FIG. 17 is a simplified diagram of a sixth integrated circuit package that includes, within the package, the die of FIG. 13, a controller on another die and two capacitors.

FIG. 17 is a simplified diagram of a sixth integrated circuit package 1700 that includes, within the package, die 1300 and controller 306 on die 503. The sixth integrated circuit package 1700 includes DC bypass capacitors 1701 and 1702 that are connected between terminals 1311 and 1312, respectively, and the DAP which is at ground potential. The DC bypass capacitors 1701 and 1702 are two-layer capacitors (not on die 1300), in which a bottom layer is connected to ground potential and in which a top layer is an insulated metal layer that is connected to terminals 1311 and 1312. The DC bypass capacitors 1701 and 1702 correspond to capacitors 1904 and 1905 of FIG. 19. A wire couples each terminal of the pair of terminals 1311 to capacitor 1904 (see FIG. 19). A wire couples one terminal the pair of terminals 1312 to capacitor 1905. Vcp is not used in the sixth integrated circuit package 1700 because the controller 306 on die 503 does not include a charge pump.

FIG. 18 is a more detailed representation of the switch 202 and the controller 206 shown in FIG. 2. Switch 202 includes a plurality of Unit HEMT cells 1821, 1822, 1823 and 1824. Each Unit HEMT cell comprises a GaN layer; a two-dimensional electron gas (2DEG) layer disposed on the GaN layer; an insulating layer disposed on the 2DEG layer; and a GaN HEMT having a gate disposed on the insulating layer, a drain adjacent to one side of the gate and a source adjacent to an opposing side of the gate. The GaN HEMT is disposed on and includes the GaN layer. The GaN HEMT has its gate connected to one contact of a 2DEG gate bias resistor. The 2DEG gate bias resistor is disposed in the 2DEG layer. Each Unit HEMT cell further comprises a HEMT cell gate electrically connected to another contact of the 2DEG gate bias resistor; a HEMT cell drain electrically connected to one contact of a 2DEG linearity resistor and to the drain of the GaN HEMT; and a HEMT cell source electrically connected to another contact of the 2DEG linearity resistor and to the source of the GaN HEMT. The 2DEG linearity resistor is disposed in the 2DEG layer. In one embodiment, the insulating layer is one of a gate dielectric layer and an aluminum gallium nitride (AlGaN) buffer layer.

The embodiment illustrated in FIG. 18 includes two series Unit HEMT cells 1822 and 1823 and two shunt Unit HEMT cells 1821 and 1824. Each Unit HEMT cell 1821, 1822, 1823 and 1824 includes two HEMTs. Each Unit HEMT includes a HEMT cell gate. The gates of the two HEMTs within each Unit HEMT cell are connected to the HEMT cell gate. The HEMT cell drain of series Unit HEMT cell 1822 and the HEMT cell drain of series Unit HEMT cell 1823 are connected to the common RF Port 203. The drain and source terminals of the HEMTs in the Unit HEMT cells 1821, 1822, 1823 and 1824 are essentially at ground potential (although they may in one embodiment be floating). The HEMTs in the Unit HEMT cells 1821, 1822, 1823 and 1824 are conducting when their gates are at ground potential. The HEMTs in the Unit HEMT cells 1821, 1822, 1823 and 1824 are not conducting when their gates are at a negative potential. In one embodiment, the negative potential is −15V.

Controller 206 includes a charge pump 1830. The controller 206 provides DC bias to selected Unit HEMTs cells of the switch 202 in a pattern to connect, through the DC block, the power amplifier output to one, and only one, of the RF outputs 205 and 207. The input lines V1, V2, V3 and V4 are coupled to a decoder 1832 and are used to select a desired output of the controller 206 through a binary control algorithm. An example of one such binary control algorithm for an SP4T switch is shown in TABLE 1, below. The extension to SP2T and/or SPNT switches is straightforward.

TABLE 1

| V1 | V2 | V3 | V4 | Out |
|----|----|----|----|-----|
| 0  | 0  | 0  | 0  | RF1 |
| +  | 0  | 0  | 0  | RF2 |
| 0  | +  | 0  | 0  | RF3 |
| +  | +  | 0  | 0  | RF4 |

To turn off a HEMT used as a switch, a gate of the HEMT is biased at a negative voltage that is usually generated by a charge pump. FIG. 18 shows four output buffers 1834 coupled to four control lines 441-444 between the controller 206 and the switch 202 for providing control signals (the negative voltage) to the HEMTs. Each control line 441-444 is coupled to one HEMT cell gate for delivery a control signal to the one Unit HEMT cell 1821, 1822, 1823 and 1824. In another embodiment, the controller 206 has two output buffers 1834 with two pads for each buffer. Switch 202 is an example of a SP2T RF switch when the common RF Port 203 is DC isolated from the drain of the PA-FET 204. In order to connect the common RF Port 203 to RF Port 1, and isolate it from RF Port 2, the control signals 443 and 444 of the output of RF Port 1 control are set high (approximately 0V) and the control signals 441 and 442 of the output of RF Port 2 control are set low (approximately −15V from an output of the charge pump 1830). The high control signal turns on the RF Port 1 series HEMTs and RF Port 2 shunt HEMTs. The low control signal turns off the RF Port 1 shunt HEMTs and the RF Port 2 series HEMTs.

Turning on the RF Port 1 series HEMTs and turning off the RF Port 1 shunt HEMTs allows RF power to pass easily between the common RF Port 203 and RF Port 1, without being attenuated by the RF Port 1 shunt HEMTs. Turning off the RF Port 2 series HEMTs and turning on the RF Port 2 shunt HEMTs blocks RF power from flowing between the common RF Port 203 and RF Port 2.

In order to connect the common RF Port 203 to RF Port 2, and isolate it from RF Port 1, the output of RF Port 2 control is set high and the output of RF Port 1 control is set low. The resulting action is the same as described above, but with "RF Port 1" replaced by "RF Port 2".

In the general case of an SPNT switch, in order to connect the common RF Port 203 to RF Port N, and isolate it from all the other RF ports, the output of RF Port N control is set high and the outputs of the other RF Port controls are set low. This turns on the RF Port N series HEMTs, and turns off the RF Port N shunt HEMTs. All the remaining series HEMTs are turned off and all the remaining shunt HEMTs are turned on.

The resistors placed across all the HEMT drain-source terminals are used to balance the voltages across these HEMTs. The resistors placed in series with each pair of gate terminals are used to isolate these terminals from the others on the same control line, and control the current flow from each gate to the corresponding control line.

The SP2T switch 202 and the controller 206 are more fully described in U.S. Pat. No. 9,548,731, entitled HIGH PERFORMANCE RADIO FREQUENCY SWITCH, issued Jan. 17, 2017 to Shah et al., and assigned to the assignee of the present application, and which is hereby fully incorporated by reference herein.

In one embodiment, the SP2T switch 202 comprises GaN HEMTs and the controller 206 comprises CMOS FETs on separate die. In another embodiment, the SP2T switch 202 comprises GaN HEMTs and the controller 206 comprises CMOS FETs, and the SP2T switch and the controller are integrated on a same die.

FIG. 19 is a more detailed representation of the switch 302 and the controller 306 shown in FIG. 3. FIG. 19 is an example of a SP2T RF switch when the common RF Port 303 is directly connected to the drain of the PA-FET 204. Switch 302 comprises a plurality of Unit HEMT cells 1921, 1922, 1923 and 1924. The embodiment illustrated in FIG. 19 includes two series Unit HEMT cells 1922 and 1923 and two shunt Unit HEMT cells 1921 and 1924. Direct connection of the drain of the PA-FET 204 and the drain of the HEMTs of the switch 302 eliminates a need for negative bias on the gate of the HEMTs of the switch. The gates of the two HEMTs within each Unit HEMT cell 1921, 1922, 1923 and 1924 are connected to the HEMT cell gate. The HEMT cell drain of series Unit HEMT cell 1922 and the HEMT cell drain of series Unit HEMT cell 1923 are connected to the common RF Port 303. The drain and source terminals of the HEMTs within each Unit HEMT cell 1921, 1922, 1923 and 1924 are essentially at the same DC voltage at the drain of the PA-FET 204. In one embodiment such DC voltage is +28V. In such one embodiment, the HEMTs within each Unit HEMT cell 1921, 1922, 1923 and 1924 are conducting when their gates are at +28V. The HEMTs within each Unit HEMT cell 1921, 1922, 1923 and 1924 are not conducting when their gates are at ground potential.

FIG. 19 shows four output buffers 1934 coupled to four control lines between the controller 206 and the switch 202.

Each control line 541-544 is coupled to one HEMT cell gate for delivery a control signal to the one Unit HEMT cell 1921, 1922, 1923 and 1924. Each RF Port control 1934 of the controller 306 is a NMOS (or a laterally diffused MOS) FET which selectively couples ground potential to the lines connected to the gates of the switch 302. This contrasts with the RF Port controls 1834 of the controller 306 which selectively couple a negative voltage to the lines connected to the gates of the switch 202. The DC bias of the PA-FET 204, typically +28V to +50V, is directly applied to the drain terminals of the HEMTs of the switch 302. This means that the HEMTs of the switch 302 can be turned off by simply grounding their gates, thus eliminating the need for an oscillator, a charge pump and a negative voltage level shifter present in controller 206. In other respects, operation of controller 306 is identical to the operation of controller 206.

In one embodiment, the switch 302 comprises GaN HEMTs and the controller 306 comprises CMOS FETs on separate die. In another embodiment, the switch 302 comprises GaN HEMTs and the controller 306 comprises CMOS FETs, and the switch and the controller are integrated on a same die.

Switch 302 includes capacitor 1904 coupled between shunt Unit HEMT cell 1921 and a ground terminal. Switch 302 also includes capacitor 1905 coupled between shunt Unit HEMT cell 1924 and the ground terminal. In one embodiment, capacitors 1904 and 1905 have a size of 1 nF to 10 nF. Capacitors 1904 and 1905 prevent the shunt Unit HEMT cells 1921 and 1924 from burning out due to the +28V to +50V DC potential on their drain terminals.

Figure 20:
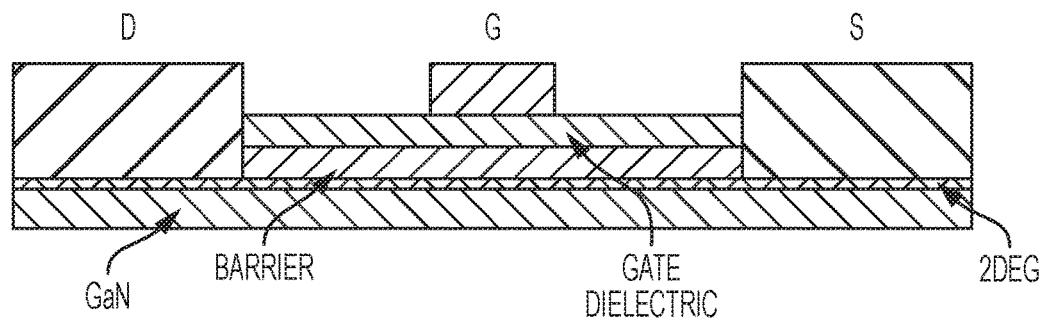
FIG. 20 is a cross-sectional view of a GaN HEMT structure with one gate, in accordance with one embodiment of the disclosure.

FIG. 20 is a cross-sectional view of a GaN HEMT structure with one gate, in accordance with one embodiment of the disclosure.

Figure 21:
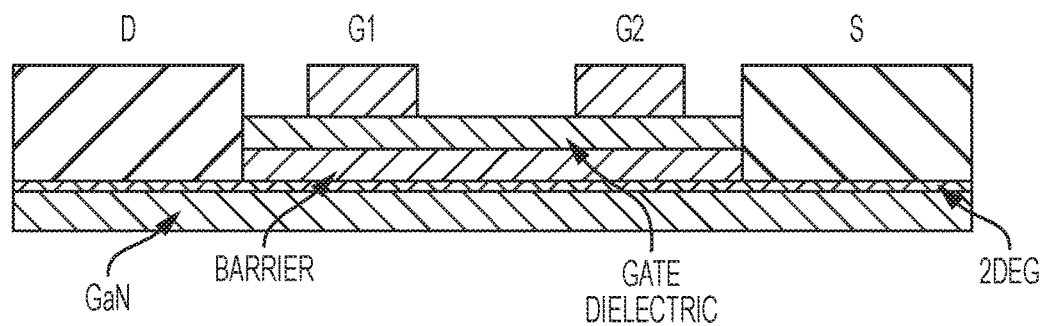
FIG. 21 is a cross-sectional view of a GaN HEMT structure with dual gates, in accordance with one embodiment of the disclosure.

FIG. 21 is a cross-sectional view of a GaN HEMT structure with dual gates, in accordance with one embodiment of the disclosure.

Figure 22:
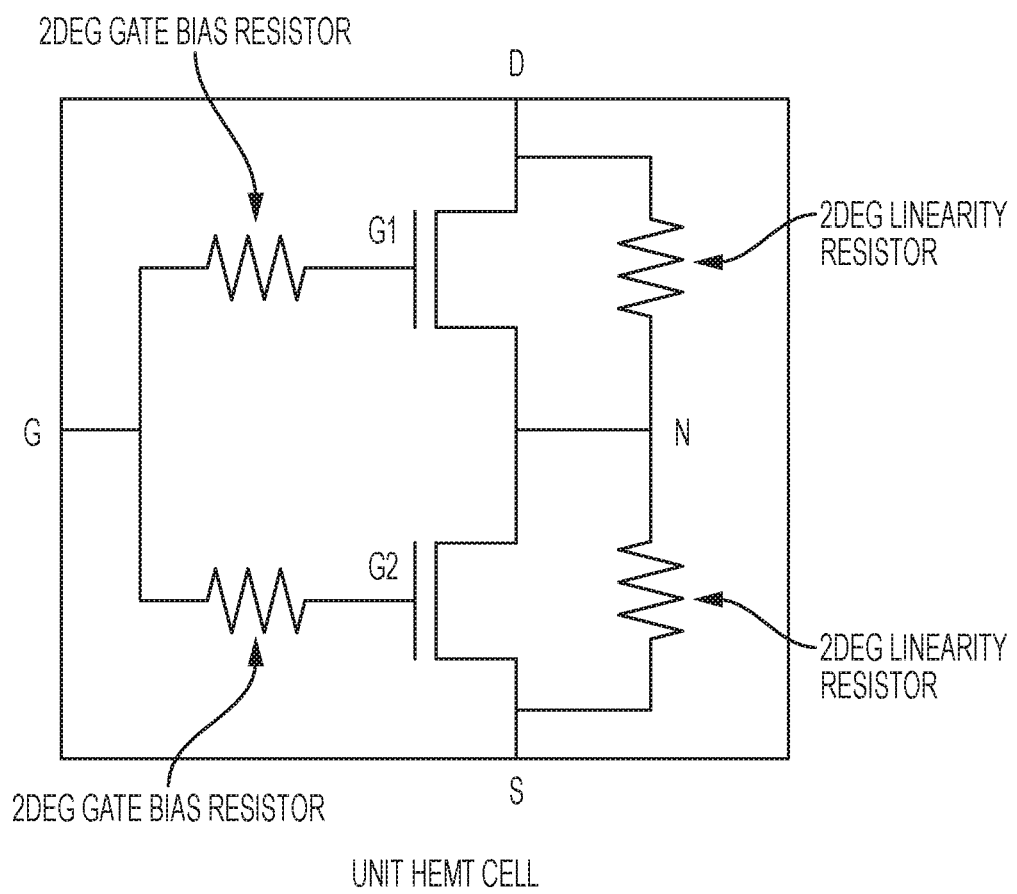
FIG. 22 is a schematic of a unit HEMT cell, in accordance with one embodiment of the disclosure.

FIG. 22 is a schematic of a unit HEMT cell, in accordance with one embodiment of the disclosure.

GaN-on-silicon technology allows the GaN HEMT switch devices and the CMOS controller devices, to be integrated on a same die, thereby making a total solution very small. The GaN HEMT devices are grown on a silicon circuit supporting substrate with a GaN layer. Because the GaN HEMT devices are grown on a silicon substrate, the same silicon substrate can be used to grow CMOS devices. In a first technique, the GaN layer is etched off and NMOS and PMOS devices are grown using a standard CMOS process. In a second alternative technique, first an insulating layer of undoped GaN is used over a whole wafer, and then new silicon layers for the CMOS are grown on top of the insulating layer. Either technique allows an RF GaN device to be integrated together with a CMOS controller device, thereby advantageously eliminating a two-die total solution.

Using either of the above techniques, a seventh integrated circuit package (not shown) is foreseen. The seventh integrated circuit package includes, within the package, a GaN power amplifier, a GaN switch, an interconnect portion between the GaN power amplifier and the GaN switch, and a CMOS controller on a single die. The interconnect portion may include a DC blocking coupling capacitor. The GaN switch may include one or more DC blocking shunt capacitors.

The circuits and IC packages disclosed herein result in cost and size reduction compared to known multi-band power amplifier circuits as a result of elimination of a wideband matching network, i.e., a transformer, between a power amplifier and a multi-band RF switch.

Advantageously a direct connection of the one or more GaN FETs of a power amplifier and the plurality of GaN HEMTs of a switch (through a DC block) enables both PA and switch to occupy the same package.

Advantageously a direct connection of GaN FETs of the one or more GaN FETs of a power amplifier and the plurality of GaN HEMTs of a switch (through a DC block) enables both PA and switch to be on the same GaN die.

Advantageously a direct connection of GaN FETs of the one or more GaN FETs of a power amplifier and the plurality of GaN HEMTs of a switch (without a DC block) eliminates the need for negative bias on the gates of the HEMTs of the switch.

The circuits and packages disclosed herein can also be used with a distributed amplifier (not shown) which comprises of a plurality of FETs interconnected by transmission lines. A distributed amplifier is typically used for microwave applications where a paralleled FET architecture cannot function due to large parasitic reactances. In one embodiment, the distributed amplifier and the switch 202 and 302 are advantageously on a same die.

Advantageously, the multi-band power amplifier circuit 200 and 300 is capable of operating at any one or more bands of frequencies between 30 MHz and 10 GHz.

The PA-FET 204 and the multi-band RF switch 202 and 302 combined in a single IC package and, in one embodiment, also disposed on a same die, may be used for a variety of wireless applications using a variety of wireless communication protocols, including short range communication protocols such as Wi-Fi (i.e., IEEE 802.11 standards), BLUETOOTH™, near field communications (NFC), and cellular protocols, including but not limited to Global System for Mobile Communications (GSM), Universal Mobile Telecommunications System (UMTS), Enhanced Data rates for GSM Evolution (EDGE), Long Term Evolution (LTE), Wi-MAX (i.e., IEEE 802.16 standards) and Land Mobile Radio (LMR).

Some features of the present invention may be used in an embodiment thereof without use of other features of the present invention. As such, the foregoing description should be considered as merely illustrative of the principles, teachings, examples, and exemplary embodiments of the present invention, and not a limitation thereof.

These embodiments are only examples of the many advantageous uses of the innovative teachings herein. In general, statements made in the specification of the present application do not necessarily limit any of the various claimed inventions. Moreover, some statements may apply to some inventive features but not to others.

The circuit as described above is part of the design for an integrated circuit chip. The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The methods as discussed above are used in the fabrication of integrated circuit chips. The resulting integrated circuit chips can be distributed by the fabricator in raw wafer form (that is, as a single wafer that has multiple unpackaged chips), as a bare chip, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products (such as, but not limited to, an information processing system) having a display, a keyboard, or other input device, and a central processor.

Detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention.

The terms "a" or "an", as used herein, are defined as one as or more than one. The term plurality, as used herein, is defined as two as or more than two. Plural and singular terms are the same unless expressly stated otherwise. The term another, as used herein, is defined as at least a second or more. The terms including and/or having, as used herein, are defined as comprising (i.e., open language). The term coupled, as used herein, is defined as connected, although not necessarily directly, and not necessarily mechanically. The terms program, software application, and the like as used herein, are defined as a sequence of instructions designed for execution on a computer system. A program, computer program, or software application may include a subroutine, a function, a procedure, an object method, an object implementation, an executable application, an applet, a servlet, a source code, an object code, a shared library/dynamic load library and/or other sequence of instructions designed for execution on a computer system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A circuit, comprising:
   a radio frequency (hereinafter "RF") power amplifier fabricated using gallium nitride (hereinafter "GaN") technology, the RF power amplifier having an output impedance at its output port;
   an interconnection portion connected directly to the output port of the RF power amplifier;
   a multi-band RF switch fabricated using GaN technology, the multi-band RF switch having a common RF port connected directly to the interconnect portion and having a plurality of RF output ports;
   a plurality of narrowband impedance matching networks, each narrowband impedance matching network having an input port coupled to one RF output port of the multi-band RF switch and having an output port, each narrowband impedance matching network configured for optimum impedance matching within a narrow RF band; and
   a plurality of RF filters, each RF filter having an input port and an output port, the input port of one RF filter coupled to the output port of one narrowband impedance matching network, each RF filter configured to pass only RF signals within the narrow RF band of the narrowband impedance matching network to which it is coupled, wherein each RF filter has an input impedance at its input port,
   wherein each narrowband impedance matching network matches the output impedance of the RF power amplifier with the input impedance of the input port of the RF filter that is coupled to the narrowband impedance matching network.

2. The circuit of claim 1, wherein the interconnection portion consists solely of an electrical conductor with one end of the electrical conductor connected to the output port of the RF power amplifier and another end of the electrical conductor connected to the common RF port of the multi-band RF switch.

3. The circuit of claim 2, wherein the multi-band RF switch includes:
   a plurality of Unit HEMT cells, each Unit HEMT cell comprising:
   a GaN layer;
   a two-dimensional electron gas (2DEG) layer disposed on the GaN layer;
   an insulating layer disposed on the 2DEG layer;
   a GaN high-electron-mobility transistor (hereinafter "HEMT"), the GaN HEMT having a gate disposed on the insulating layer, a drain adjacent to one side of the gate and a source adjacent to an opposing side of the gate, the GaN HEMT disposed on and including the GaN layer, and the GaN HEMT having its gate connected to one contact of a 2DEG gate bias resistor, the 2DEG gate bias resistor disposed in the 2DEG layer;
   a HEMT cell gate electrically connected to another contact of the 2DEG gate bias resistor;
   a HEMT cell drain electrically connected to one contact of a 2DEG linearity resistor and to the drain of the GaN HEMT; and
   a HEMT cell source electrically connected to another contact of the 2DEG linearity resistor and to the source of the GaN HEMT, the 2DEG linearity resistor being disposed in the 2DEG layer.

4. The circuit of claim 2, wherein the RF power amplifier includes a GaN field-effect transistor (hereinafter "PA-FET") having a gate terminal coupled to an input port of the RF power amplifier, a drain coupled to a direct current (DC) supply voltage for biasing the PA-FET at a positive voltage, and a source terminal coupled to ground potential.

5. The circuit of claim 4, wherein the multi-band RF switch includes at least two series Unit HEMT cells and at least two shunt Unit HEMT cells, wherein a cell drain of each series Unit HEMT cell is coupled to the DC supply voltage for biasing the at least two series Unit HEMT cells at a same positive voltage at which the PA-FET is biased.

6. The circuit of claim 2, including a controller for controlling operation of the multi-band RF switch, the controller separately coupled to the HEMT cell gate of each Unit HEMT cell of the multi-band RF switch for separately controlling each Unit HEMT cell.

7. The circuit of claim 1, wherein the interconnection portion consists solely of a capacitor with one end of the capacitor connected to the output port of the RF power amplifier and another end of the capacitor connected to the common RF port of the multi-band RF switch.

8. The circuit of claim 7, wherein the RF power amplifier includes a GaN field-effect transistor (hereinafter "PA-FET") having a gate terminal coupled to an input port of the RF power amplifier, a drain coupled to a direct current (DC) supply voltage for biasing the PA-FET at a positive voltage, and a source terminal coupled to ground potential.

9. The circuit of claim 8, wherein the multi-band RF switch includes:
a plurality of Unit HEMT cells, each Unit HEMT cell comprising:
a GaN layer;
a two-dimensional electron gas (2DEG) layer disposed on the GaN layer;
an insulating layer disposed on the 2DEG layer;
a GaN high-electron-mobility transistor (hereinafter "HEMT"), the GaN HEMT having a gate disposed on the insulating layer, a drain adjacent to one side of the gate and a source adjacent to an opposing side of the gate, the GaN HEMT disposed on and including the GaN layer, and the GaN HEMT having its gate connected to one contact of a 2DEG gate bias resistor, the 2DEG gate bias resistor disposed in the 2DEG layer;
a HEMT cell gate electrically connected to another contact of the 2DEG gate bias resistor;
a HEMT cell drain electrically connected to one contact of a 2DEG linearity resistor and to the drain of the GaN HEMT; and
a HEMT cell source electrically connected to another contact of the 2DEG linearity resistor and to the source of the GaN HEMT, the 2DEG linearity resistor being disposed in the 2DEG layer.

10. The circuit of claim 9, including a controller separately coupled to the HEMT cell gate of each Unit HEMT cell of the multi-band RF switch for separately controlling each Unit HEMT cell.

11. An integrated circuit (hereinafter "IC") package, comprising:
a field-effect transistor disposed on a gallium nitride (hereinafter "GaN") layer over a first silicon substrate (hereinafter "PA-FET") housed within the IC package, the PA-FET having a gate terminal, a drain terminal coupled to a direct current (hereinafter "DC") supply voltage for biasing the PA-FET at a positive voltage, and a source terminal coupled to ground potential, the PA-FET having an output impedance at the drain terminal; and
a multi-band RF switch disposed on a GaN layer over a second silicon substrate housed within the IC package, the multi-band RF switch including a plurality of Unit HEMT cells, the multi-band RF switch having a common RF port connected directly to the drain terminal of the PA-FET without any intervening impedance matching network and having a plurality of RF output ports, wherein a connection between the PA-FET and the multi-band RF switch is totally within the IC package.

12. The IC package of claim 11, wherein each Unit HEMT cell of the plurality of Unit HEMT cells includes:
a two-dimensional electron gas (2DEG) layer disposed on the GaN layer;
an insulating layer disposed on the 2DEG layer;
a GaN high-electron-mobility transistor (hereinafter "HEMT"), the GaN HEMT having a gate disposed on the insulating layer, a drain adjacent to one side of the gate and a source adjacent to an opposing side of the gate, the GaN HEMT disposed on and including the GaN layer, and the GaN HEMT having its gate connected to one contact of a 2DEG gate bias resistor, the 2DEG gate bias resistor disposed in the 2DEG layer;
a HEMT cell gate electrically connected another contact of the 2DEG gate bias resistor;
a HEMT cell drain electrically connected to one contact of a 2DEG linearity resistor and to the drain of the GaN HEMT; and
a HEMT cell source electrically connected to another contact of the 2DEG linearity resistor and to the source of the GaN HEMT, the 2DEG linearity resistor being disposed in the 2DEG layer.

13. The IC package of claim 12, wherein the multi-band RF switch includes at least two series Unit HEMT cells and at least two shunt Unit HEMT cells, wherein a cell drain of each series Unit HEMT cell is coupled to the DC supply voltage for biasing the at least two series Unit HEMT cells at a same positive voltage at which the PA-FET is biased.

14. The IC package of claim 12, including a controller disposed on a third silicon substrate housed within the IC package, wherein the controller is separately coupled to the HEMT cell gate of each Unit HEMT cell of the multi-band RF switch for separately controlling each Unit HEMT cell.

15. The IC package of claim 11 including
a plurality of narrowband impedance matching networks housed within the IC package, each narrowband impedance matching network having an input port coupled to one RF output port of the multi-band RF switch and having an output port, each narrowband impedance matching network configured for optimum impedance matching within a narrow RF band; and
a plurality of RF filters housed within the IC package, each RF filter having an input port and an output port, the input port of one RF filter coupled to the output port of one narrowband impedance matching network, each RF filter configured to pass only RF signals within the narrow RF band of the narrowband impedance matching network to which it is coupled, wherein each RF filter has an input impedance at its input port,
wherein each narrowband impedance matching network matches the output impedance of the drain terminal of the PA-FET with the input impedance of the input port of the RF filter coupled to the narrowband impedance matching network.

16. An integrated circuit (hereinafter "IC") package, comprising:
a field-effect transistor disposed on a gallium nitride (hereinafter "GaN") layer over a silicon substrate (hereinafter "PA-FET"), the PA-FET having a gate terminal, a drain terminal coupled to a direct current (hereinafter "DC") supply voltage for biasing the PA-FET at a positive voltage, and a source terminal coupled to ground potential, the PA-FET having an output impedance at the drain terminal; and
a multi-band RF switch including a plurality of Unit HEMT cells, the multi-band RF switch disposed on a GaN layer over the silicon substrate, the multi-band RF switch having a common RF port connected directly to the drain terminal of the PA-FET without any intervening impedance matching network and having a plurality of RF output ports,
wherein the silicon substrate is housed within the IC package.

17. The IC package of claim 16, wherein each Unit HEMT cell of the plurality of Unit HEMT cells, includes:
a two-dimensional electron gas (2DEG) layer disposed on the GaN layer;
an insulating layer disposed on the 2DEG layer;
a GaN high-electron-mobility transistor (hereinafter "HEMT"), the GaN HEMT having a gate disposed on the insulating layer, a drain adjacent to one side of the gate and a source adjacent to an opposing side of the gate, the GaN HEMT disposed on and including the GaN layer, and the GaN HEMT having its gate connected to one contact of a 2DEG gate bias resistor, the 2DEG gate bias resistor disposed in the 2DEG layer;
a HEMT cell gate electrically connected to another contact of the 2DEG gate bias resistor;
a HEMT cell drain electrically connected to one contact of a 2DEG linearity resistor and to the drain of the GaN HEMT; and
a HEMT cell source electrically connected to the other contact of the 2DEG linearity resistor and to the source of the GaN HEMT, the 2DEG linearity resistor being disposed in the 2DEG layer.

18. The IC package of claim 17, wherein the multi-band RF switch includes at least two series Unit HEMT cells and at least two shunt Unit HEMT cells, wherein a cell drain of each series Unit HEMT cell is coupled to the DC supply voltage for biasing the at least two series Unit HEMT cells at a same positive voltage at which the PA-FET is biased.

19. The IC package of claim 16, including at least one metal-insulator-metal (hereinafter "MIM") capacitor disposed on the silicon substrate, the at least one MIM capacitor coupling the multi-band RF switch to ground potential.

20. The IC package of claim 16, including a controller, fabricated using CMOS technology and disposed on the silicon substrate, wherein the controller is separately coupled to the HEMT cell gate of each Unit HEMT cell of the multi-band RF switch for separately controlling each Unit HEMT cell.

* * * * *